United States Patent
Katoh et al.

(10) Patent No.: US 11,987,742 B2
(45) Date of Patent: *May 21, 2024

(54) POLYMERIZABLE LIQUID CRYSTAL COMPOSITION, CURED PRODUCT, OPTICAL FILM, POLARIZING PLATE, AND IMAGE DISPLAY DEVICE

(71) Applicant: FUJIFILM Corporation, Tokyo (JP)

(72) Inventors: Shunya Katoh, Kanagawa (JP); Hiroshi Inada, Kanagawa (JP); Masaaki Suzuki, Kanagawa (JP); Yuki Nakamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/697,526

(22) Filed: Mar. 17, 2022

(65) Prior Publication Data

US 2022/0213384 A1 Jul. 7, 2022

Related U.S. Application Data

(63) Continuation of application No. PCT/JP2020/036158, filed on Sep. 25, 2020.

(30) Foreign Application Priority Data

Sep. 27, 2019 (JP) .................... 2019-177821

(51) Int. Cl.
| | | |
|---|---|---|
| *G02F 1/1333* | (2006.01) | |
| *C09K 19/02* | (2006.01) | |
| *C09K 19/30* | (2006.01) | |
| *C09K 19/34* | (2006.01) | |
| *G02B 5/30* | (2006.01) | |
| *C09K 19/04* | (2006.01) | |

(52) U.S. Cl.
CPC .......... *C09K 19/3003* (2013.01); *C09K 19/02* (2013.01); *C09K 19/3068* (2013.01); *C09K 19/3491* (2013.01); *G02B 5/3016* (2013.01); *G02B 5/3025* (2013.01); *C09K 2019/0448* (2013.01); *C09K 2019/3004* (2013.01); *C09K 2019/3075* (2013.01); *C09K 2019/3077* (2013.01)

(58) Field of Classification Search
CPC ................ C09K 19/3003; C09K 19/02; C09K 19/3068; C09K 19/3491; C09K 19/46; C09K 19/3852; C09K 19/3804; C09K 2019/0444; C09K 2019/0448; C09K 2019/3004; C09K 2019/3075; C09K 2019/3077; C09K 2019/3497; C09K 2019/546; G02F 1/13363; G02F 1/1333
See application file for complete search history.

(56) References Cited

U.S. PATENT DOCUMENTS

| | | | | |
|---|---|---|---|---|
| 10,048,416 | B2* | 8/2018 | Muramatsu | ............ C09K 19/32 |
| 11,001,653 | B2* | 5/2021 | Muramatsu | .......... G02B 5/3083 |
| 11,230,669 | B2* | 1/2022 | Akutagawa | ............... G09F 9/00 |
| 2015/0002789 | A1 | 1/2015 | Kaihoko et al. | |
| 2015/0079380 | A1 | 3/2015 | Muramatsu et al. | |
| 2015/0277006 | A1 | 10/2015 | Takasago et al. | |
| 2016/0068756 | A1 | 3/2016 | Moriya et al. | |
| 2018/0022716 | A1* | 1/2018 | Horiguchi | ............ C07D 405/12 526/257 |
| 2018/0201701 | A1 | 7/2018 | Muramatsu et al. | |
| 2018/0356578 | A1 | 12/2018 | Atsumi et al. | |
| 2019/0264106 | A1 | 8/2019 | Takahashi et al. | |
| 2019/0276742 | A1 | 9/2019 | Takahashi et al. | |
| 2020/0109333 | A1 | 4/2020 | Akutagawa et al. | |
| 2022/0213384 | A1* | 7/2022 | Katoh | .................... H05B 33/02 |
| 2022/0214484 | A1* | 7/2022 | Iwasaki | ................ G02B 5/3016 |
| 2022/0267675 | A1* | 8/2022 | Sumi | ..................... C08F 220/20 |

FOREIGN PATENT DOCUMENTS

| | | |
|---|---|---|
| CN | 104950371 A | 9/2015 |
| CN | 110023347 A | 7/2019 |
| CN | 110023800 A | 7/2019 |
| JP | 2015-200861 A | 11/2015 |
| JP | 2016-006439 A | 1/2016 |
| JP | 2016-051178 A | 4/2016 |
| JP | 2019-056727 A | 4/2019 |
| WO | 2017/057545 A1 | 4/2017 |
| WO | 2017/145935 A1 | 8/2017 |
| WO | 2018/016567 A1 | 1/2018 |
| WO | 2019/009255 A1 | 1/2019 |

OTHER PUBLICATIONS

International Search Report issued in PCT/JP2020/036158 dated Nov. 24, 2020.

Written Opinion issued in PCT/JP2020/036158 dated Nov. 24, 2020.

International Preliminary Report on Patentability completed by WIPO dated Mar. 15, 2022 in connection with International Patent Application No. PCT/JP2020/036158.

(Continued)

*Primary Examiner* — Geraldina Visconti

(74) *Attorney, Agent, or Firm* — Edwards Neils LLC; Jean C. Edwards, Esq.

(57) ABSTRACT

Provided is a polymerizable liquid crystal composition with which an image display device having an excellent contrast can be manufactured; and a cured product, an optical film, a polarizing plate, and an image display device. The polymerizable liquid crystal composition contains a compound represented by Formula (I). $L^1\text{-}SP^1\text{-}D^5\text{-}(A^1)_{a1}\text{-}D^3\text{-}(G^1)_{g1}\text{-}D^1\text{-}[Ar\text{-}D^2]_{q1}\text{-}(G^2)_{g2}\text{-}D^4\text{-}(A^2)_{a2}\text{-}D^6\text{-}SP^2\text{-}L^2$ . . . (I), and a compound represented by Formula (II), $L^5\text{-}SP^5\text{-}D^9\text{-}(A^5)_{a3}\text{-}D^{10}\text{-}(G^3)_{g3}\text{-}D^{11}\text{-}M$ . . . (II).

14 Claims, 1 Drawing Sheet

(56) References Cited

OTHER PUBLICATIONS

Office Action, issued by the State Intellectual Property Office of China dated Oct. 27, 2023, in connection with Chinese Patent Application No. 202080066746.6.

\* cited by examiner

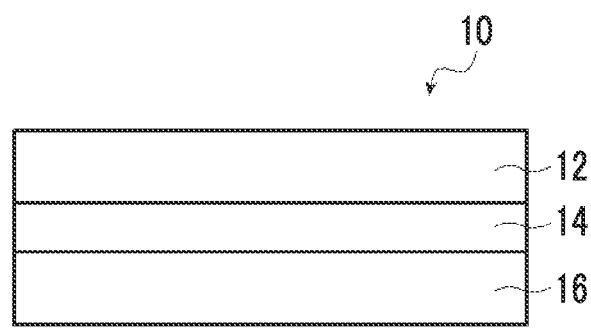

POLYMERIZABLE LIQUID CRYSTAL COMPOSITION, CURED PRODUCT, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2020/036158 filed on Sep. 25, 2020, which was published under PCT Article 21(2) in Japanese, and which claims priority under 35 U.S.C. § 119(a) to Japanese Patent Application No. 2019-177821 filed on Sep. 27, 2019. The above applications are hereby expressly incorporated by reference, in their entirety, into the present application.

BACKGROUND OF THE INVENTION

1. Field of the Invention

The present invention relates to a polymerizable liquid crystal composition, a cured product, an optical film, a polarizing plate, and an image display device.

2. Description of the Related Art

Optical films such as an optical compensation sheet and a phase difference film are used in various image display devices in order to eliminate image coloration or expand a viewing angle.

A stretched birefringent film has been used as the optical film, but in recent years, it has been proposed to use an optical film having an optically anisotropic layer consisting of a liquid crystal compound instead of the stretched birefringent film.

As such an optically anisotropic layer, for example, an optically anisotropic layer in which a polymerizable composition including one or more polymerizable rod-shaped liquid crystal compounds exhibiting a smectic phase is immobilized in a state of exhibiting a smectic phase is described in JP2015-200861A ([Claim 1]).

In addition, a phase difference film in which a liquid crystal compound exhibiting a smectic phase is immobilized in the smectic phase, the phase difference film including a non-liquid crystal compound satisfying a predetermined condition, is described in JP2016-051178A ([Claim 1]).

SUMMARY OF THE INVENTION

The present inventors have conducted investigations on the optically anisotropic layer described in JP2015-200861A and the phase difference film described in JP2016-051178A, and have thus found that there is room for improvement in terms of the contrast of an image display device having the optically anisotropic layer or the phase difference film.

Therefore, an object of the present invention is to provide a polymerizable liquid crystal composition with which an image display device having an excellent contrast can be manufactured; and a cured product, an optical film, a polarizing plate, and an image display device.

The present inventors have conducted intensive studies to accomplish the object, and as a result, they have thus found that by using a polymerizable liquid crystal composition obtained by blending a compound represented by Formula (I) which will be described later and a compound represented by Formula (II) which will be described late, the contrast of an image display device thus manufactured is good, thereby completing the present invention.

That is, the present inventors have found that the object can be accomplished by the following configurations.

[1] A polymerizable liquid crystal composition comprising:
a compound represented by Formula (I); and
a compound represented by Formula (II).

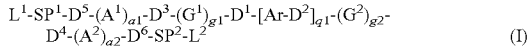
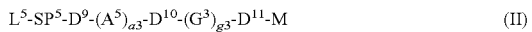

[2] The polymerizable liquid crystal composition as described in [1],
in which an array of aromatic rings and alicyclic rings included in this order between L1 or $L^2$ and Ar in Formula (I) is the same as an array of aromatic rings and alicyclic rings included in this order between $L^5$ and M in Formula (II).

It should be noted that in a case where all of objects to be compared are aromatic rings with regard to the array of the aromatic rings and the alicyclic rings, it is considered that the rings constitute the same array even though the rings have different ring structures or substituents; and in a case where all of objects to be compared are alicyclic rings, it is considered that the rings constitute the same array even though the rings have different ring structures or substituents. In addition, the array of the aromatic rings and the alicyclic rings do not include a structure of a linking portion between the aromatic ring and the alicyclic ring.

[3] The polymerizable liquid crystal composition as described in [1] or [2],
in which the polymerizable liquid crystal composition indicates a liquid crystal state of a smectic phase.

[4] The polymerizable liquid crystal composition as described in any one of [1] to [3],
in which all of a1, a2, g1, and g2 in Formula (I) are 1 and both of a3 and g3 in Formula (II) are 1.

[5] The polymerizable liquid crystal composition as described in any one of [1] to [4],
in which at least one of $A^5$ or $G^3$ in Formula (II) is a 1,4-cyclohexylene group.

[6] The polymerizable liquid crystal composition as described in any one of [1] to [5],
in which the number of atoms in SP1 and $SP^2$ in Formula (I) is larger than the number of atoms in $SP^5$ in Formula (II).

It should be noted that the number of atoms in $SP^1$ in Formula (I) represents the number of atoms on a bond that links $L^1$ and $D^5$ in Formula (I) at a shortest distance, and a hydrogen atom is not included.

Furthermore, it should be noted that the number of atoms in $SP^2$ in Formula (I) represents the number of atoms on a bond that links $L^2$ and $D^6$ in Formula (I) at a shortest distance, and a hydrogen atom is not included.

In addition, the number of atoms in $SP^5$ in Formula (II) represents the number of atoms on a bond that links $L^5$ and $D^9$ in Formula (II) at a shortest distance, and a hydrogen atom is not included.

[7] The polymerizable liquid crystal composition as described in any one of [1] to [6],
in which both of $G^1$ and $G^2$ in Formula (I) are 1,4-cyclohexylene groups, and
$G^3$ in Formula (II) is a 1,4-cyclohexylene group.

[8] The polymerizable liquid crystal composition as described in any one of [1] to [7],
in which $A^1$ and $A^2$ in Formula (I) and $A^5$ in Formula (II) have the same structure.

[9] The polymerizable liquid crystal composition as described in any one of [1] to [8], in which in Formula (I), a1 and a2 are 0, g1 and g2 are 1, and $G^1$ and $G^2$ are 1,4-cyclohexylene groups, and in Formula (II), a3 is 0, g3 is 1, and $G^3$ is a 1,4-cyclohexylene group.

[10] The polymerizable liquid crystal composition as described in any one of [1] to [9], in which $L^1$ and $L^2$ in Formula (I) and $L^5$ in Formula (II) each represent any of polymerizable groups selected from the group consisting of groups represented by Formulae (P-1) to (P-20).

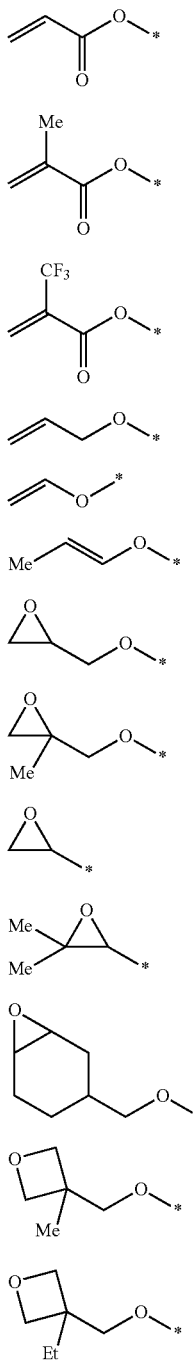

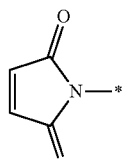

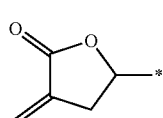

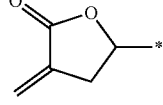

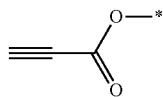

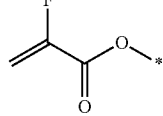

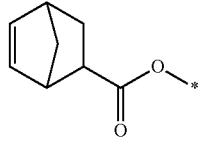

Here, in Formulae (P-1) to (P-20), * represents a bonding position to any of $SP^1$, $SP^2$, and $SP^5$.

[11] The polymerizable liquid crystal composition as described in any one of [1] to [10], in which a content of the compound represented by Formula (II) is 5 to 100 parts by mass with respect to 100 parts by mass of the compound represented by Formula (I).

[12] A cured product obtained by curing the polymerizable liquid crystal composition as described in any one of [1] to [11].

[13] An optical film comprising the cured product as described in [12].

[14] A polarizing plate comprising:

the optical film as described in [13]; and a polarizer.

[15] An image display device comprising the optical film as described in [13] or the polarizing plate as described in [14].

According to the present invention, it is possible to provide a polymerizable liquid crystal composition with which an image display device having an excellent contrast can be manufactured; and a cured product, an optical film, a polarizing plate, and an image display device.

BRIEF DESCRIPTION OF THE DRAWINGS

FIG. 1 is a schematic cross-sectional view showing an example of the optical film of an embodiment of the present invention.

DESCRIPTION OF THE PREFERRED EMBODIMENTS

Hereinafter, the present invention will be described in detail.

Descriptions on the constitutional requirements which will be described later are made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit value and the upper limit value, respectively.

In addition, in the present specification, only one kind of the substance corresponding to each component may be used alone or two or more kinds thereof may also be used in combination, for each component. Here, in a case where the two or more kinds of substances are used in combination for each component, the content of the component refers to a total content of the substances used in combination unless otherwise specified.

In addition, in the present specification, the bonding direction of a divalent group (for example, —CO—NR—) as noted is not particularly limited unless the bonding position is specified, and for example, in a case where $D^1$ in Formula (I) which will be described later is —CO—NR—, $D^1$ may be either *1-CO—NR-*2 or *1-NR—CO-*2, in which *1 represents a bonding position to the $G^1$ side and *2 represents a bonding position to the $Ar^1$ side.

Polymerizable Liquid Crystal Composition

The polymerizable liquid crystal composition of an embodiment of the present invention is a polymerizable liquid crystal composition containing a compound represented by Formula (I) (hereinafter also simply referred to as a "reverse dispersion liquid crystal compound") and a compound represented by Formula (II) (hereinafter also simply referred to as a "specific compound").

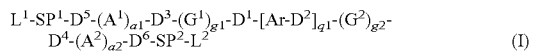

(I)

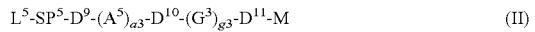

(II)

In the present invention, by using the polymerizable liquid crystal composition obtained by blending the specific compound together with the reverse dispersion liquid crystal compound as described above, the contrast of an image display device thus manufactured is good.

A reason therefor is not specifically clear, but is presumed to be as follows by the present inventors.

First, as shown in Comparative Examples 1 to 5 which will be described later, it can be seen that the contrast is deteriorated in a case where the specific compound is not blended. This is considered to be caused by the following fact: in a case where the alignment state of the polymerizable liquid crystal composition is immobilized, that is, in a case where the polymerizable liquid crystal composition is polymerized (cured), volume shrinkage occurs, and as a result, disturbance of the alignment state occurs.

In contrast, as shown in Examples 1 to 5 which will be described later, it can be seen that the contrast is good in a case where the specific compound is blended, but as shown in Comparative Examples 6 to 10 which will be described later, it can be seen that the contrast is not improved in a case where the compound having a structure similar to the specific compound is blended.

Therefore, in the present invention, it is considered that the specific compound easily enters and stays between the molecules of the reverse dispersion liquid crystal compound due to a terminal structure represented by M in Formula (II), and as a result, the contrast is good for a reason that volume shrinkage due to the polymerization of the reverse dispersion liquid crystal compound can be alleviated.

Hereinafter, the respective components of the polymerizable liquid crystal composition of the embodiment of the present invention will be described in detail.

Reverse Dispersion Liquid Crystal Compound

The reverse dispersion liquid crystal compound contained in the polymerizable liquid crystal composition of the embodiment of the present invention is a compound represented by Formula (I).

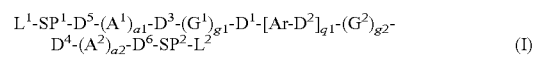

(I)

In Formula (I), a1, a2, g1, and g2 each independently represent 0 or 1. It should be noted that at least one of a1 or g1 represents 1, and at least one of a2 or g2 represents 1.

In addition, in Formula (I), q1 represents 1 or 2.

Moreover, in Formula (I), $D^1$, $D^2$, $D^3$, $D^4$, $D^1$, and $D^6$ each independently represent a single bond; —CO—, —O—, —S—, —C(=S)—, —CR$^1$R$^2$—, —CR$^3$=CR$^4$—, —NR$^5$—, or a divalent linking group consisting of a combination of two or more of these groups, and $R^1$ to $R^5$ each independently represent a hydrogen atom, a fluorine atom, or an alkyl group having 1 to 12 carbon atoms. It should be noted that in a case where q1 is 2, a plurality of $D^2$'s may be the same as or different from each other.

In addition, in Formula (I), $G^1$ and $G^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$-'s constituting the alicyclic hydrocarbon group may be substituted with —O—, —S—, or —NH—.

In addition, in Formula (I), $A^1$ and $A^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$-'s constituting the alicyclic hydrocarbon group may be substituted with —O—, —S—, or —NH—.

Furthermore, in Formula (I), SP$^1$ and SP$^2$ each independently represent a single bond, a linear or branched alkylene group having 1 to 12 carbon atoms, or a divalent linking group in which one or more of —CH$_2$-'s constituting the linear or branched alkylene group having 1 to 12 carbon atoms are substituted with —O—, —S—, —NH—, —N(Q)-, or —CO—, where Q represents a substituent.

In addition, in Formula (I), $L^1$ and $L^2$ each independently represent a monovalent organic group, and at least one of $L^1$ or $L^2$ represents a polymerizable group. It should be noted that in a case where Ar is an aromatic ring represented by Formula (Ar-3), at least one of $L^1$ or $L^2$, or $L^3$ or $L^4$ in Formula (Ar-3) represents a polymerizable group.

In Formula (I), it is preferable that any of a1, a2, g1, and g2 is 1 for a reason that the polymerizable liquid crystal composition of the embodiment of the present invention is more likely to exhibit a liquid crystal state of a smectic phase.

In addition, it is preferable that both of a1 and a2 are 0 and both of g1 and g2 are 1 for a reason that the contrast of an image display device thus manufactured is better.

In Formula (I), q1 is preferably 1.

In Formula (I), examples of the divalent linking group shown by one aspect of $D^1$, $D^2$, $D^3$, $D^4$, $D^5$, and $D^6$ include —CO—, —O—, —CO—O—, —C(=S)O—, —$CR^1R^2$—, —$CR^1R^2$—$CR^1R^2$—, —O—$CR^1R^2$—, —$CR^1R^2$—O—$CR^1R^2$—, —CO—O—$CR^1R^2$—, —O—CO—$CR^1R^2$—, —$CR^1R^2$—O—CO—$CR^1R^2$—, —$CR^1R^2$—CO—O—$CR^1R^2$—, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

Among these, any of —CO—, —O—, and —CO—O— is preferable.

In Formula (I), examples of the aromatic ring having 6 to 20 carbon atoms, shown by one aspect of $G^1$ and $G^2$, include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring. Among those, the benzene ring (for example, a 1,4-phenyl group) is preferable.

In Formula (I), the divalent alicyclic hydrocarbon group having 5 to 20 carbon atoms, shown by one aspect of $G^1$ and $G^2$, is preferably a 5- or 6-membered ring. In addition, the alicyclic hydrocarbon group may be saturated or unsaturated, but is preferably a saturated alicyclic hydrocarbon group. With regard to the divalent alicyclic hydrocarbon group represented by each of $G^1$ and $G^2$, reference can be made to, for example, the description in paragraph [0078] of JP2012-21068A, the contents of which are hereby incorporated by reference.

In the present invention, $G^1$ and $G^2$ in Formula (I) are each preferably a cycloalkane ring for a reason that the contrast of an image display device thus manufactured is better.

Specific examples of the cycloalkane ring include a cyclohexane ring, a cyclopeptane ring, a cyclooctane ring, a cyclododecane ring, and a cyclodocosane ring.

Among those, the cyclohexane ring is preferable, a 1,4-cyclohexylene group is more preferable, and a trans-1,4-cyclohexylene group is still more preferable.

In addition, in $G^1$ and $G^2$ in Formula (I), examples of a substituent which may be contained in the aromatic ring having 6 to 20 carbon atoms or the divalent alicyclic hydrocarbon group having 5 to 20 carbon atoms include an alkyl group, an alkoxy group, an alkylcarbonyl group, an alkoxycarbonyl group, an alkylcarbonyloxy group, an alkylamino group, a dialkylamino group, an alkylamide group, an alkenyl group, an alkynyl group, a halogen atom, a cyano group, a nitro group, an alkylthiol group, and an N-alkylcarbamate group, and among these, the alkyl group, the alkoxy group, the alkoxycarbonyl group, the alkylcarbonyloxy group, or the halogen atom is preferable.

As the alkyl group, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the alkoxycarbonyl group include a group in which an oxycarbonyl group (—O—CO— group) is bonded to the alkyl group exemplified above, and among these, the alkoxycarbonyl group is preferably a methoxycarbonyl group, an ethoxycarbonyl group, an n-propoxycarbonyl group, or an isopropoxycarbonyl group, and more preferably the methoxycarbonyl group.

Examples of the alkylcarbonyloxy group include a group in which a carbonyloxy group (—CO—O— group) is bonded to the alkyl group exemplified above, and among these, the alkylcarbonyloxy group is preferably a methylcarbonyloxy group, an ethylcarbonyloxy group, an n-propylcarbonyloxy group, or an isopropylcarbonyloxy group, and more preferably the methylcarbonyloxy group.

Examples of the halogen atom include a fluorine atom, a chlorine atom, a bromine atom, and an iodine atom, and among these, the fluorine atom or the chlorine atom is preferable.

In Formula (I), examples of the aromatic ring having 6 to 20 or more carbon atoms, shown by one aspect of $A^1$ and $A^2$, include the same ones as those described in $G^1$ and $G^2$ in Formula (I).

In addition, in Formula (I), examples of the divalent alicyclic hydrocarbon group having 5 to 20 carbon atoms, shown by one aspect of $A^1$ and $A^2$, include the same ones as those described in $G^1$ and $G^2$ in Formula (I).

Moreover, in $A^1$ and $A^2$, examples of the substituent which may be contained in the aromatic ring having 6 to 20 carbon atoms or the divalent alicyclic hydrocarbon group having 5 to 20 carbon atoms include the same ones as those of the substituent which may be contained in each of $G^1$ and $G^2$ in Formula (I).

Suitable examples of the linear or branched alkylene group having 1 to 12 carbon atoms, shown by one aspect of $SP^1$ and $SP^2$, in Formula (I) include a methylene group, an ethylene group, a propylene group, a butylene group, a pentylene group, a hexylene group, a methylhexylene group, and a heptylene group. Furthermore, $SP^1$ and $SP^2$ may be a divalent linking group in which one or more of —$CH_2$—'s constituting the linear or branched alkylene group having 1 to 12 carbon atoms are substituted with —O—, —S—, —NH—, —N(Q)-, or —CO—, and examples of the substituent represented by Q include the same ones as those of the substituent which may be contained in each of $G^1$ and $G^2$ in Formula (I).

In Formula (I), examples of the monovalent organic group represented by each of $L^1$ and $L^2$ include an alkyl group, an aryl group, and a heteroaryl group. The alkyl group may be linear, branched, or cyclic, but is preferably linear. The number of carbon atoms of the alkyl group is preferably 1 to 30, more preferably 1 to 20, and still more preferably 1 to 10. Further, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatom constituting the heteroaryl group is preferably a nitrogen atom, a sulfur atom, or an oxygen atom. The number of carbon atoms of the heteroaryl group is preferably 6 to 18, and more preferably 6 to 12. In addition, the alkyl group, the aryl group, and the heteroaryl group may be unsubstituted or have a substituent. Examples of the substituent include the same ones as those of the substituent which may be contained in each of $G^1$ and $G^2$ in Formula (I).

In Formula (I), the polymerizable group represented by at least one of $L^1$ or $L^2$ is not particularly limited, but is preferably a polymerizable group which is radically polymerizable or cationically polymerizable.

A known radically polymerizable group can be used as the radically polymerizable group, and suitable examples thereof include an acryloyloxy group or a methacryloyloxy group. In this case, it is known that the acryloyloxy group generally has a high polymerization rate, and from the viewpoint of improvement of productivity, the acryloyloxy group is preferable but the methacryloyloxy group can also be used as the polymerizable group.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is suitable, and an epoxy group, an oxetanyl group, or the vinyloxy group is particularly preferable.

Particularly preferred examples of the polymerizable group include a polymerizable group represented by any of Formulae (P-1) to (P-20).

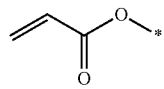
(P-1)

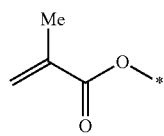
(P-2)

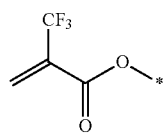
(P-3)

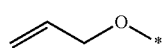
(P-4)

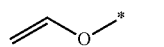
(P-5)

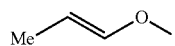
(P-6)

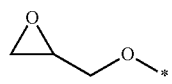
(P-7)

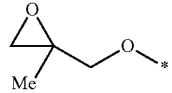
(P-8)

(P-9)

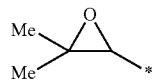
(P-10)

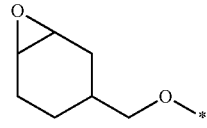
(P-11)

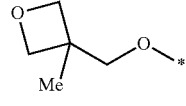
(P-12)

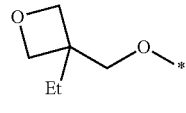
(P-13)

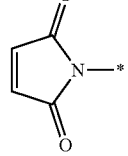
(P-14)

HS—*
(P-15)

(P-16)

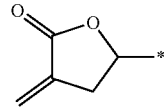
(P-17)

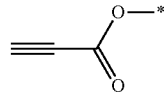
(P-18)

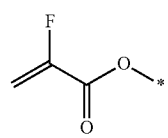
(P-19)

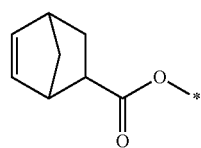
(P-20)

For a reason that the durability is good, either of $L^1$ and $L^2$ in Formula (I) is preferably a polymerizable group, and more preferably an acryloyloxy group or a methacryloyloxy group in Formula (I).

On the other hand, in Formula (I), Ar represents any of aromatic rings selected from the group consisting of groups represented by Formulae (Ar-1) to (Ar-7). It should be noted that in a case where q1 is 2, a plurality of Ar's may be the same as or different from each other. Furthermore, in Formulae (Ar-1) to (Ar-7), * represents a bonding position to $D^1$ or $D^2$ in Formula (I).

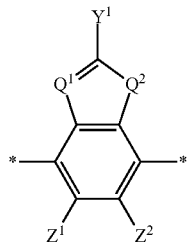
(Ar-1)

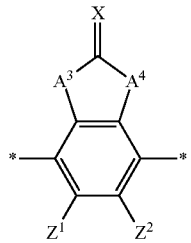
(Ar-2)

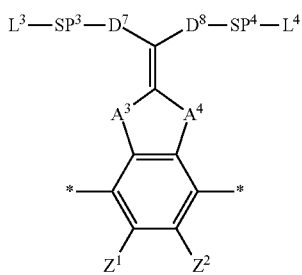
(Ar-3)

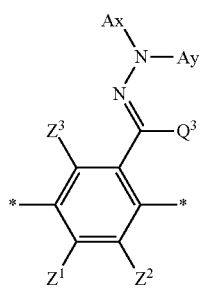
(Ar-4)

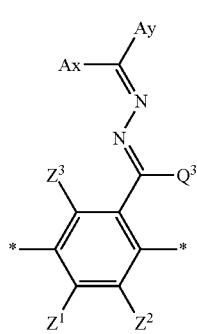
(Ar-5)

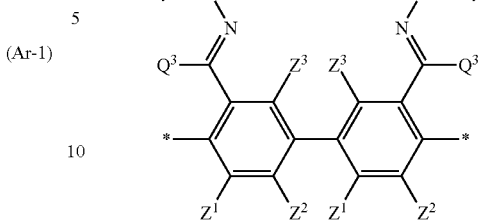
(Ar-6)

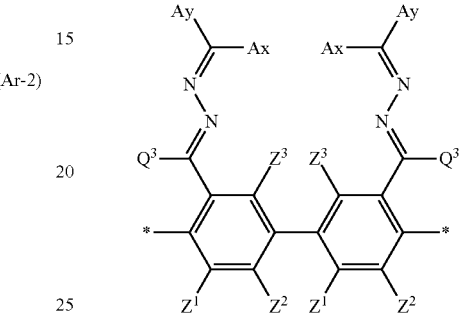
(Ar-7)

In Formula (Ar-1), $Q^1$ represents N or CH, $Q^2$ represents —S—, —O—, or —N($R^6$)—, Re represents a hydrogen atom or an alkyl group having 1 to 6 carbon atoms, and $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —$CH_2$—'s constituting the alicyclic hydrocarbon group may be substituted with —O—, —S—, or —NH—.

Specific examples of the alkyl group having 1 to 6 carbon atoms, represented by $R^6$, include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms, represented by $Y^1$, include aryl groups such as a phenyl group, a 2,6-diethylphenyl group, and a naphthyl group.

Examples of the aromatic heterocyclic group having 3 to 12 carbon atoms, represented by $Y^1$, include heteroaryl groups such as a thienyl group, a thiazolyl group, a furyl group, and a pyridyl group.

Examples of the alicyclic hydrocarbon group having 6 to 20 carbon atoms, represented by $Y^1$, include a cyclohexylene group, a cyclopentylene group, a norbornene group, and an adamantylene group.

In addition, examples of the substituent which may be contained in $Y^1$ include the same ones as those of the substituent which may be contained in each of $G^1$ and $G^2$ in Formula (I).

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —OR$^7$, —NR$^8$R$^9$, —SR$^{10}$, —COOR$^{11}$, or —COR$^{12}$, where R$^7$ to R$^{12}$ each independently represent a hydrogen atom or an alkyl group having 1 to 6 carbon atoms, and Z$^1$ and Z$^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, and specifically include a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Specific examples of the monovalent aromatic heterocyclic group having 6 to 20 carbon atoms include a 4-pyridyl group, a 2-furyl group, a 2-thienyl group, a 2-pyrimidinyl group, and a 2-benzothiazolyl group.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms, represented by each of R$^7$ to R$^{10}$, include a methyl group, an ethyl group, a propyl group, an isopropyl group, an n-butyl group, an isobutyl group, a sec-butyl group, a tert-butyl group, an n-pentyl group, and an n-hexyl group.

As described above, Z$^1$ and Z$^2$ may be bonded to each other to form an aromatic ring, and examples of the structure in a case where Z$^1$ and Z$^2$ in Formula (Ar-1) are bonded to each other form an aromatic ring include a group represented by Formula (Ar-1a). Furthermore, in Formula (Ar-1a), * represents a bonding position to D$^1$ or D$^2$ in Formula (I).

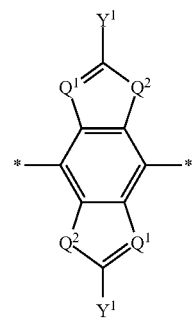

(Ar-1a)

Here, in Formula (Ar-1a), examples of Q$^1$, Q$^2$, and Y$^1$ include the same ones as those described in Formula (Ar-1).

In addition, in Formulae (Ar-2) and (Ar-3), A$^3$ and A$^4$ each independently represent a group selected from the group consisting of —O—, —N(R$^{13}$)—, —S—, and —CO—, where R$^{13}$ represents a hydrogen atom or a substituent.

Examples of the substituent represented by R$^{13}$ include the same ones as those of the substituent which may be contained in each of G$^1$ and G$^2$ in Formula (I).

In addition, in Formula (Ar-2), X represents a hydrogen atom or a non-metal atom of Groups XIV to XVI, to which a substituent may be bonded.

Furthermore, examples of the non-metal atom of Groups XIV to XVI represented by X include an oxygen atom, a sulfur atom, a nitrogen atom to which a hydrogen atom or a substituent is bonded [=N—R$^{N1}$, R$^{N1}$ represents a hydrogen atom or a substituent], and a carbon atom to which a hydrogen atom or a substituent is bonded [=C—(R$^{C1}$)$_2$, R$^{C1}$ represents a hydrogen atom or a substituent].

Examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), D$^7$ and D$^8$ each independently represent a single bond; or —CO—, —O—, —S—, —C(=S)—, —CR$^1$R$^2$—, —CR$^3$=CR$^4$—, —NR$^5$—, or a divalent linking group consisting of a combination of two or more of these groups, where R$^1$ to R$^5$ each independently represent a hydrogen atom, a fluorine atom, or an alkyl group having 1 to 12 carbon atoms.

Here, specific examples of the divalent linking group include the same ones as those described in D$^1$, D$^2$, D$^1$, D$^4$, D$^5$, and D$^6$ in Formula (I).

Moreover, in Formula (Ar-3), SP$^3$ and SP$^4$ each independently represent a single bond, a linear or branched alkylene group having 1 to 12 carbon atoms, or a divalent linking group in which one or more of —CH$_2$-'s constituting the linear or branched alkylene group having 1 to 12 carbon atoms are substituted with —O—, —S—, —NH—, —N(Q)-, or —CO—, where Q represents a substituent. Examples of the substituent include the same ones as those of the substituent which may be contained in each of G$^1$ and G$^2$ in Formula (I).

Here, examples of the alkylene group include the same ones as those described in SP$^1$ and SP$^2$ in Formula (I).

Furthermore, in Formula (Ar-3), L$^3$ and L$^4$ each independently represent a monovalent organic group, and at least one of L$^3$ or L$^4$, or L$^1$ or L$^2$ in Formula (I) represents a polymerizable group.

Examples of the monovalent organic group include the same ones as those described in $L^1$ and $L^2$ in Formula (I).

In addition, examples of the polymerizable group include the same ones as those of the polymerizable groups described for $L^1$ and $L^2$ in Formula (I).

Moreover, in Formulae (Ar-4) to (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of each of Ax and Ay include the ones described in paragraphs [0039] to [0095] of WO2014/010325A.

Incidentally, specific examples of the alkyl group having 1 to 20 carbon atoms, represented by $Q^3$, include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as those of the substituent which may be contained in each of $G^1$ and $G^2$ in Formula (I).

Examples of the compound represented by Formula (I) include the compounds represented by General Formula (I) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (I) described in JP2016-081035A (in particular, the compounds described in paragraph Nos. [0043] to [0055]).

Moreover, suitable examples of the compound represented by Formula (I) include compounds represented by Formulae (1) to (22), and specific examples thereof include the compounds having side chain structures shown in Tables 1 to 3 below as K (side chain structure) in Formulae (1) to (22).

Furthermore, in Tables 1 to 3 below, "*" shown in the side chain structure of K represents a bonding position to an aromatic ring.

In addition, in the side chain structures shown in 2-2 in Table 2 below and 3-2 in Table 3 below, a group adjacent to each of the acryloyloxy group and the methacryloyl group represents a propylene group (a group in which a methyl group is substituted with an ethylene group), and represents a mixture of regioisomers in which the positions of the methyl groups are different.

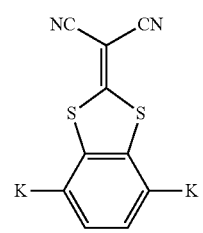

(1)

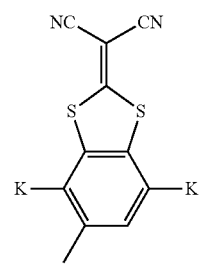

(2)

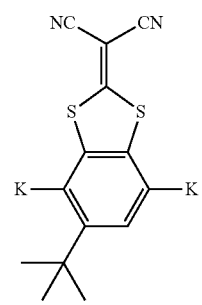

(3)

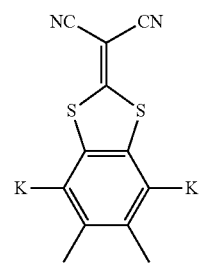

(4)

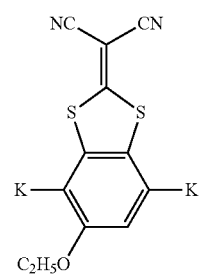

(5)

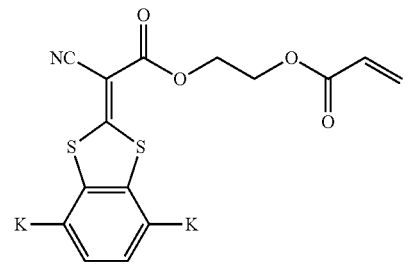

(6)

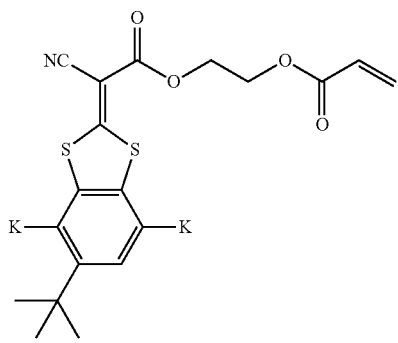
(7)
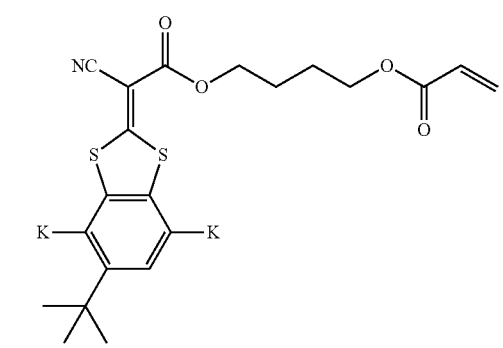
(8)
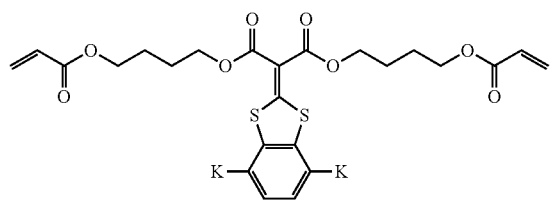
(9)
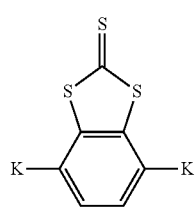
(10)
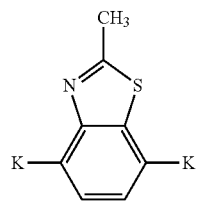
(11)
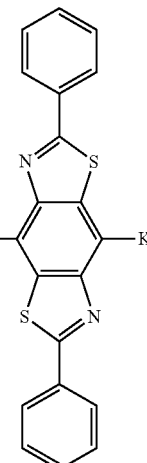
(12)
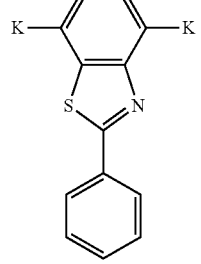
(13)
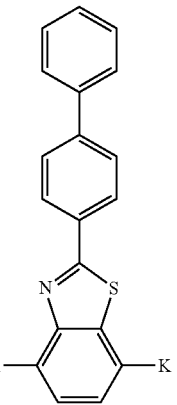
(14)

(15)
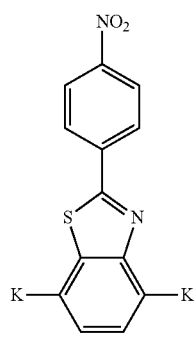
(16)
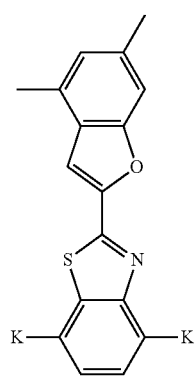
(17)
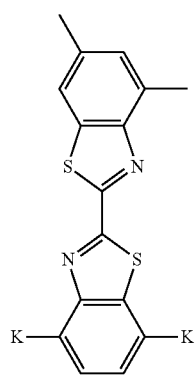
(18)
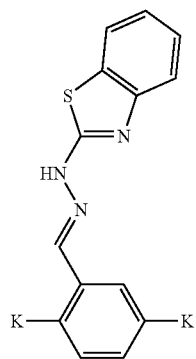
(19)
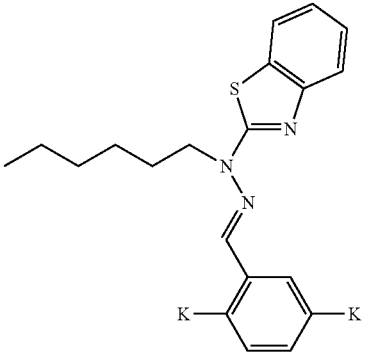
(20)
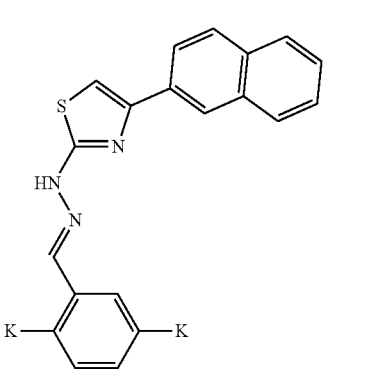
(21)
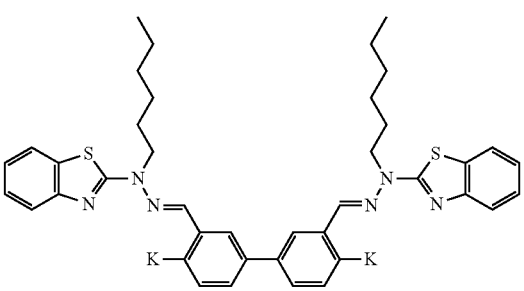
(22)
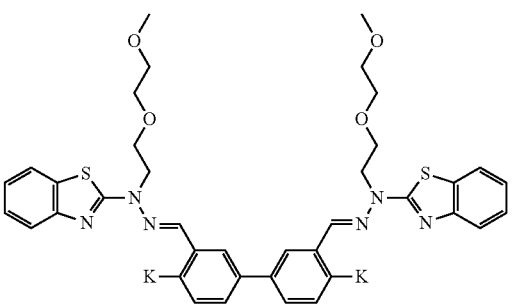

TABLE 1
| | K (side chain structure) |
|---|---|
| 1-1 | 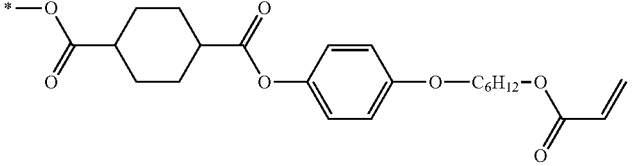 |
| 1-2 | 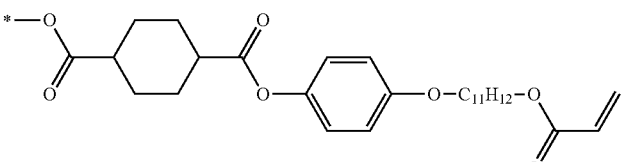 |
| 1-3 | 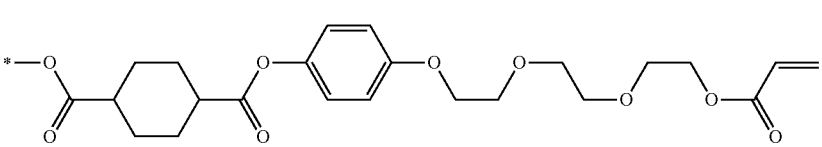 |
| 1-4 | 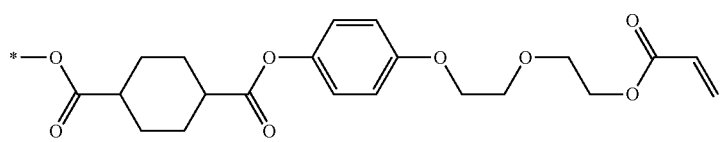 |
| 1-5 | 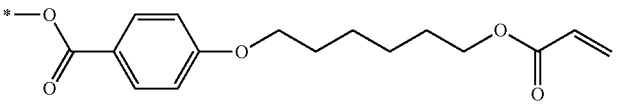 |
| 1-6 | 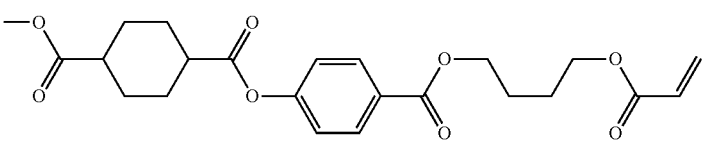 |
TABLE 2
| | K (side chain structure) |
|---|---|
| 2-1 | 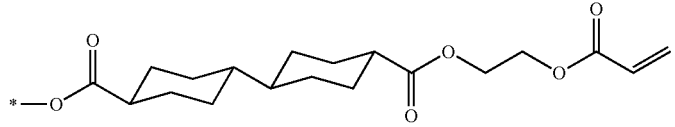 |
| 2-2 | 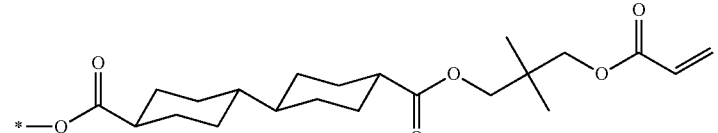 |
| 2-3 | 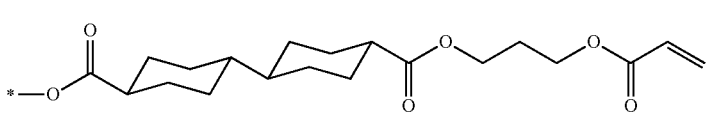 |

TABLE 2-continued
| | K (side chain structure) |
|---|---|
| 2-4 | 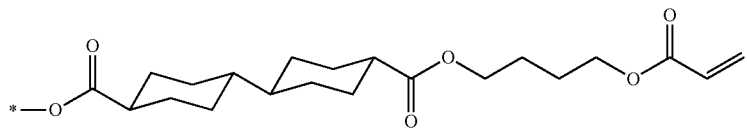 |
| 2-5 | 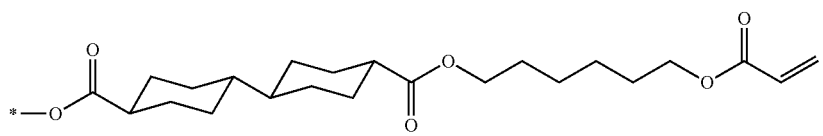 |
| 2-6 | 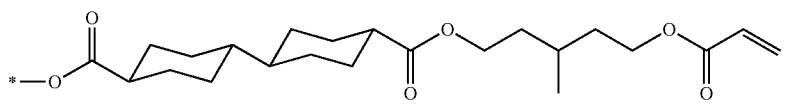 |
| 2-7 | 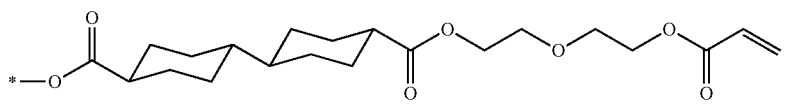 |
| 2-8 | 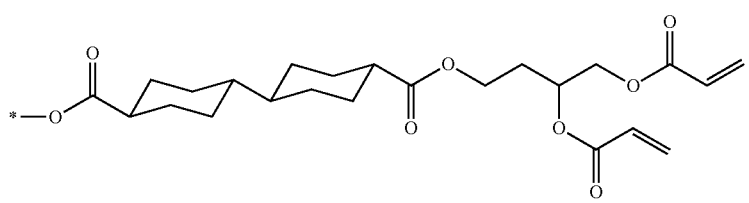 |
| 2-9 | 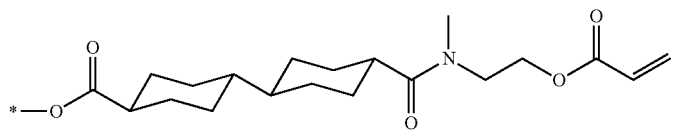 |
| 2-10 | 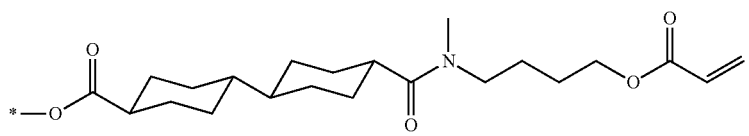 |
| 2-11 | 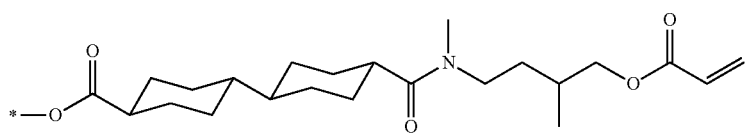 |
| 2-12 | 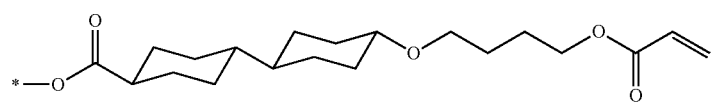 |
| 2-13 | 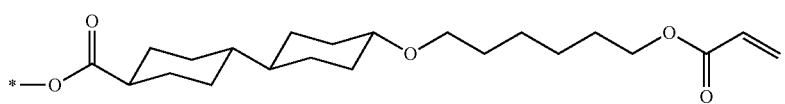 |
| 2-14 |  |

TABLE 3
| | K (side chain structure) |
|---|---|
| 3-1 | 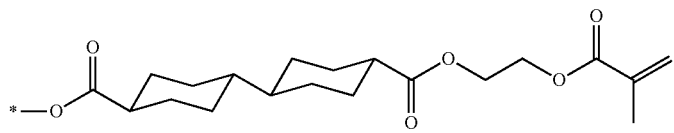 |
| 3-2 | 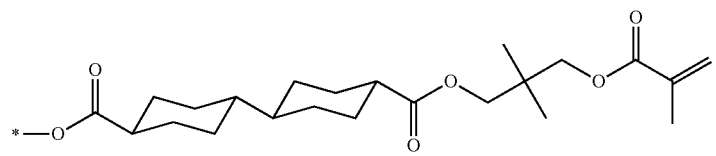 |
| 3-3 | 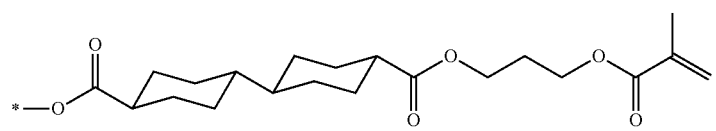 |
| 3-4 | 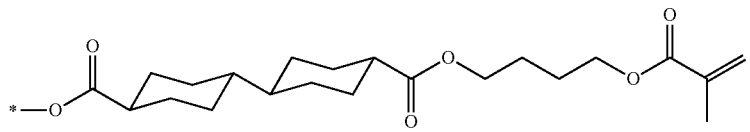 |
| 3-5 | 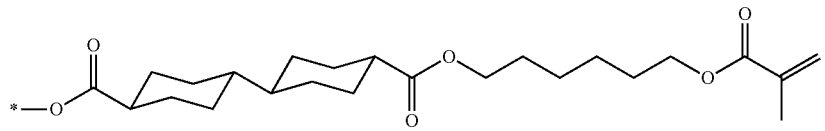 |
| 3-6 | 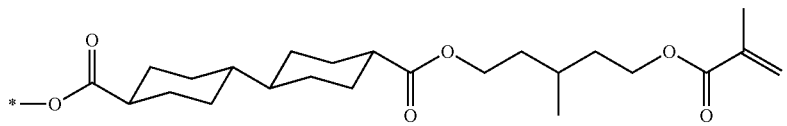 |
| 3-7 | 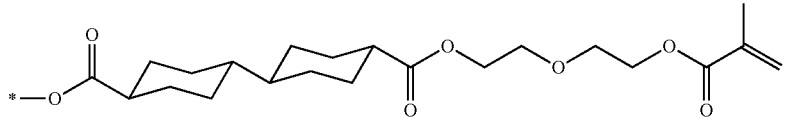 |
| 3-8 | 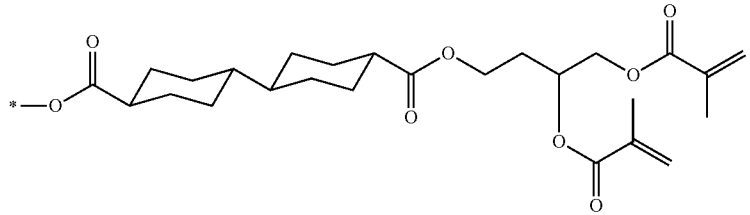 |
| 3-9 | 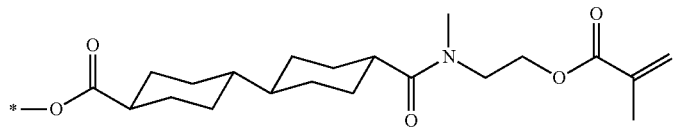 |
| 3-10 | 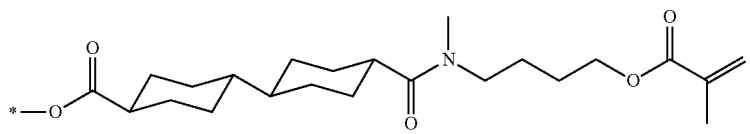 |

TABLE 3-continued

K (side chain structure)

3-11

3-12

3-13

3-14

In the present invention, it is preferable that the compound represented by Formula (I) is a compound exhibiting a liquid crystal state of a smectic phase for a reason that the contrast of an image display device thus manufactured is better.

Specific Compound

The specific compound contained in the polymerizable liquid crystal composition of the embodiment of the present invention is a compound represented by Formula (II).

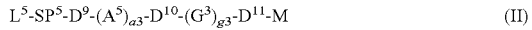

In Formula (II), a3 and g3 each independently represent an integer of 0 to 2. It should be noted that a3 and g3 represent integers of 1 to 3 in total.

Furthermore, in Formula (II), $D^9$, $D^{10}$, and $D^{11}$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms.

In addition, in Formula (II), $G^3$ represents an aromatic ring having 6 to 20 carbon atoms, which may have a substituent, or a divalent alicyclic hydrocarbon group having 5 to 20 carbon atoms, which may have a substituent, and one or more of —$CH_2$-'s constituting the alicyclic hydrocarbon group may be substituted with —O—, —S—, or —NH—. It should be noted that in a case where g3 is 2, a plurality of $G^3$'s may be the same as or different from each other.

In addition, in Formula (II), $A^5$ represents an aromatic ring having 6 to 20 carbon atoms, which may have a substituent, or a divalent alicyclic hydrocarbon group having 5 to 20 carbon atoms, which may have a substituent, and one or more of —$CH_2$-'s constituting the alicyclic hydrocarbon group may be substituted with —O—, —S—, or —NH—. It should be noted that in a case where a3 is 2, a plurality of $A^5$'s may be the same as or different from each other.

In addition, in Formula (II), $SP^5$ represents a single bond, a linear or branched alkylene group having 1 to 12 carbon atoms, or a divalent linking group in which one or more of —$CH_2$-'s constituting the linear or branched alkylene group having 1 to 12 carbon atoms are substituted with —O—, —S—, —NH—, —N(Q)-, or —CO—, where Q represents a substituent.

Furthermore, in Formula (II), $L^5$ represents a polymerizable group.

In Formula (II), it is preferable that either of a3 and g3 is 1 for a reason that the polymerizable liquid crystal composition of the embodiment of the present invention is more likely to exhibit a liquid crystal state of a smectic phase.

In addition, it is preferable that a3 is 0 and g3 is 1 for a reason that the contrast of an image display device thus manufactured is better.

In Formula (II), examples of the divalent linking group shown by one aspect of $D^9$, $D^{10}$, and $D^{11}$ include the same ones as those exemplified as the divalent linking group shown by one aspect of $D^1$ and the like in Formula (I), and among these, any of —CO—, —O—, and —CO—O— is preferable.

In Formula (II), examples of the aromatic ring having 6 to 20 carbon atoms, shown by one aspect of $G^3$, include the same ones of those exemplified as the aromatic ring having 6 to 20 carbon atoms, shown by one aspect of $G^1$ and the like in Formula (I), and among these, a benzene ring (for example, a 1,4-phenyl group) is preferable.

In Formula (II), examples of the divalent alicyclic hydrocarbon group having 5 to 20 carbon atoms, shown by one aspect of $G^3$, include the same ones as those exemplified as the divalent alicyclic hydrocarbon group having 5 to 20 carbon atoms, shown by one aspect of $G^1$ and the like in Formula (I), and among these, a cycloalkane ring is preferable, a cyclohexane ring is more preferable, a 1,4-cyclohexylene group is still more preferable, and a trans-1,4-cyclohexylene group is particularly preferable for a reason that the contrast of an image display device thus manufactured is better.

Moreover, in $G^3$ in Formula (II), examples of the substituent which may be contained in the aromatic ring having 6 to 20 carbon atoms or the divalent alicyclic hydrocarbon group having 5 to 20 carbon atoms include the same ones as those of the substituent which may be contained in each of $G^1$ and $G^2$ in Formula (I).

In Formula (II), examples of the aromatic ring having 6 to 20 or more carbon atoms, shown by one aspect of $A^5$, include the same ones as those described in $G^1$ and $G^2$ in Formula (I).

In addition, in Formula (II), examples of the divalent alicyclic hydrocarbon group having 5 to 20 carbon atoms, shown by one aspect of $A^5$, include the same ones as those described in $G^1$ and $G^2$ in Formula (I).

Moreover, in $A^5$, examples of the substituent which may be contained in the aromatic ring having 6 to 20 carbon atoms or the divalent alicyclic hydrocarbon group having 5 to 20 carbon atoms include the same ones as those of the substituent which may be contained in each of $G^1$ and $G^2$ in Formula (I).

In the present invention, it is preferable that at least one of $A^5$ or $G^3$ in Formula (II) is a 1,4-cyclohexylene group for a reason that the reverse wavelength dispersion is improved.

In Formula (II), examples of the linear or branched alkylene group having 1 to 12 carbon atoms, shown by one aspect of $SP^5$, include the same ones as those exemplified as the linear or branched alkylene group having 1 to 12 carbon atoms, shown by one aspect of $SP^1$ and the like in Formula (I).

In Formula (II), examples of the polymerizable group represented by $L^5$ include the same ones as those exemplified as the polymerizable group represented by at least one of $L^1$ or $L^2$ in Formula (I), and among these, suitable examples of the polymerizable group include the polymerizable group represented by any of Formulae (P-1) to (P-20).

On the other hand, in Formula (II), M represents any of terminal groups selected from the group consisting of groups represented by Formulae (M-1) to (M-3). Furthermore, in Formulae (M-1) to (M-3), * represents a bonding position to $D^{11}$.

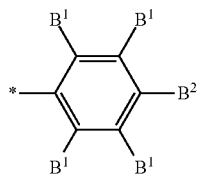
(M-1)

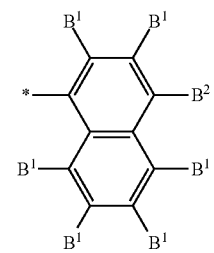
(M-2)

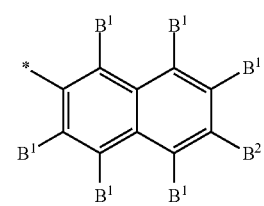
(M-3)

In Formulae (M-1) to (M-3), a plurality of $B^1$'s each independently represent a hydrogen atom or a substituent. Here, examples of the substituent include the same ones as those of the substituent which may be contained in each of $G^1$ and $G^2$ in Formula (I).

Furthermore, in Formulae (M-1) to (M-3), $B^2$ represents a hydrogen atom or a fluorine atom, and is preferably the hydrogen atom for a reason that the contrast of an image display device thus manufactured is better.

Among Formulae (M-1) to (M-3), Formula (M-1) is preferable for a reason that the contrast of an image display device thus manufactured is better.

Specific examples of the compound represented by Formula (II) include compounds represented by Formulae (CR-1) to (CR-18).

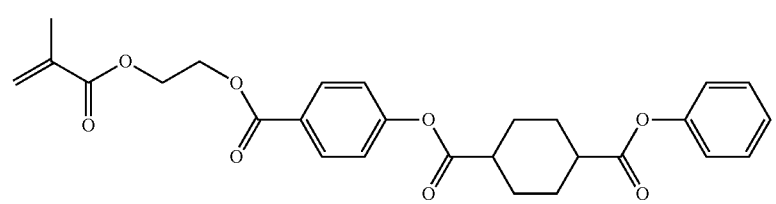
(CR-1)

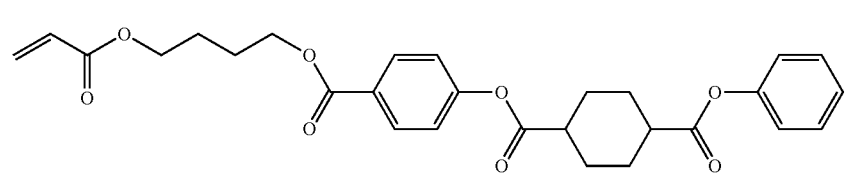
(CR-2)

-continued
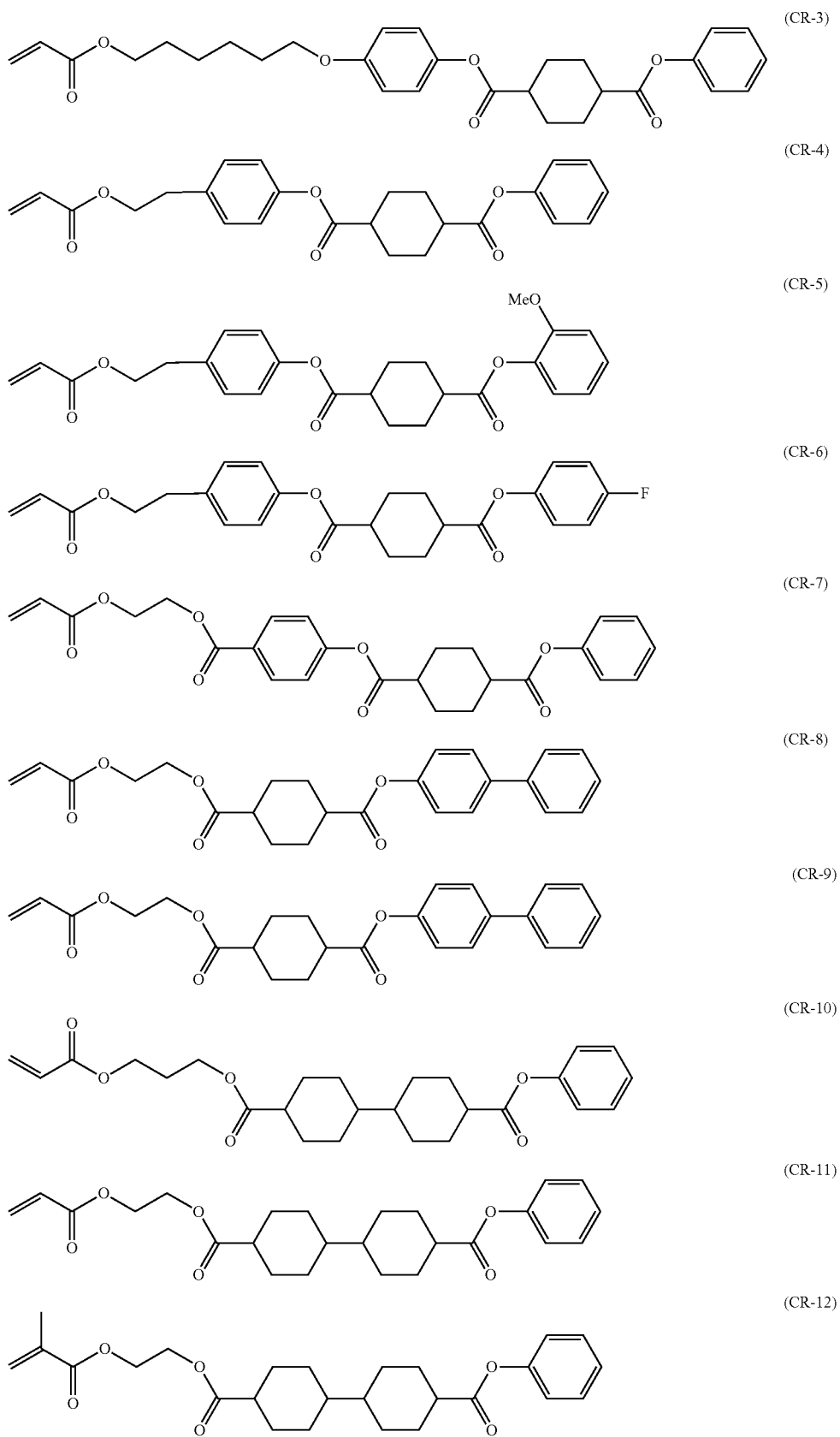

-continued

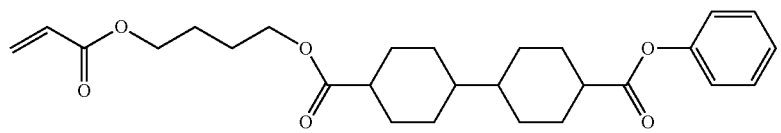
(CR-13)

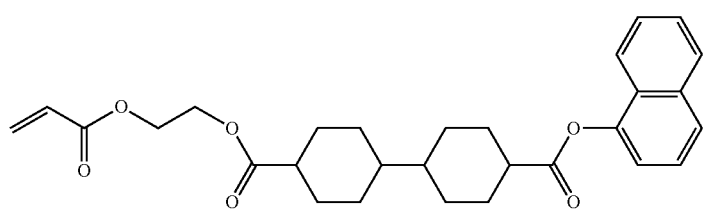
(CR-14)

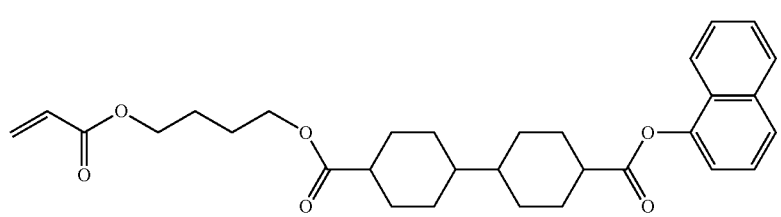
(CR-15)

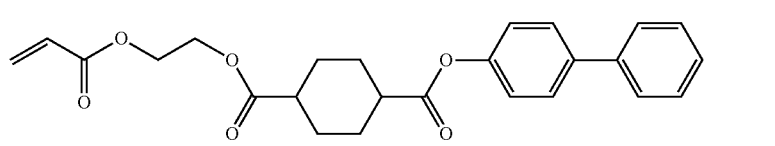
(CR-16)

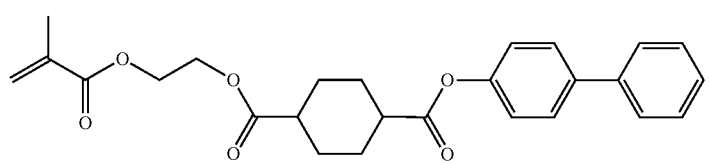
(CR-17)

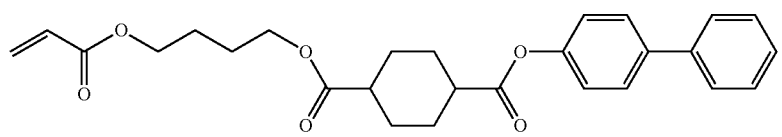
(CR-18)

In the present invention, a content of the compound represented by Formula (II) is preferably 5 to 100 parts by mass, and more preferably 6 to 50 parts by mass with respect to 100 parts by mass of the compound represented by Formula (I) for a reason that the contrast of an image display device thus manufactured is better.

In the present invention, it is preferable that an array of aromatic rings and alicyclic rings included in this order between $L^1$ or $L^2$ and Ar in Formula (I) is the same as an array of aromatic rings and alicyclic rings included in this order between $L^5$ and M in Formula (II) for a reason that the contrast of an image display device thus manufactured is better.

Here, in a case where all of objects to be compared are aromatic rings with regard to the array of the aromatic rings and the alicyclic rings, it is considered that the rings constitute the same array even though the rings have different ring structures or substituents; and in a case where all of objects to be compared are alicyclic rings, it is considered that the rings constitute the same array even though the rings have different ring structures or substituents. In addition, the array of the aromatic rings and the alicyclic rings do not include a structure of a linking portion between the aromatic ring and the alicyclic ring. In a case where the rings are all aromatic rings, it is considered that the rings constitute the same array even though the rings have different skeletons as in cases with, for example, phenylene and naphthylene; and in a case where the rings are all alicyclic rings, it is considered that the rings constitute the same array even though the rings have different skeletons as in cases with, for example, cyclohexylene and cyclopentalene.

In the present invention, it is preferable that the number of atoms in $SP^1$ and $SP^2$ in Formula (I) is larger than the number of atoms in $SP^5$ in Formula (II) for a reason that the contrast of an image display device thus manufactured is better.

Here, the number of atoms in $SP^1$ in Formula (I) represents the number of atoms on a bond that links $L^1$ and $D^5$ in Formula (I) at the shortest distance, and a hydrogen atom is not included.

Furthermore, it should be noted that the number of atoms in $SP^2$ in Formula (I) represents the number of atoms on a bond that links $L^2$ and $D^6$ in Formula (I) at a shortest distance, and a hydrogen atom is not included.

In addition, the number of atoms in $SP^5$ in Formula (II) represents the number of atoms on a bond that links $L^5$ and $D^9$ in Formula (II) at a shortest distance, and a hydrogen atom is not included.

For example, any of the number of atoms in $SP^1$ and $SP^2$ of the reverse dispersion liquid crystal compound represented by the following formula, which corresponds to the compound represented by Formula (I), is 6.

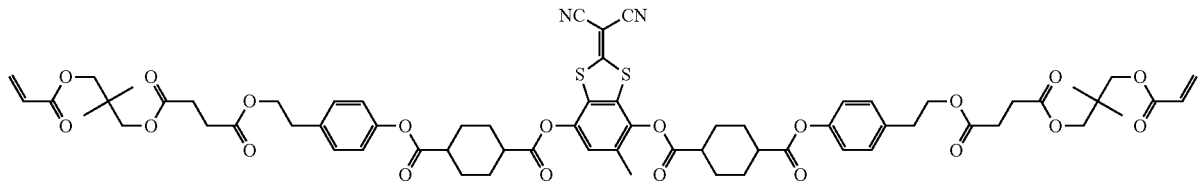 [SMILES: C=CC(=O)OCC(C)(C)COC(=O)CCC(=O)OCCc1ccc(OC(=O)C2CCC(C(=O)Oc3cc(C)c(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

In addition, the number of atoms in $SP^3$ of the specific compound represented by Formula (CR-1), which corresponds to the compound represented by Formula (II), is 2.

(CR-1)

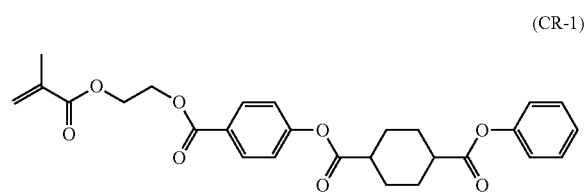 [SMILES: C=C(C)C(=O)OCCOC(=O)c1ccc(OC(=O)C2CCC(C(=O)Oc3ccccc3)CC2)cc1]

In the present invention, it is preferable that $A^1$ and $A^2$ in Formula (I) and $A^5$ in Formula (II) have the same structure for a reason that the contrast of an image display device thus manufactured is better.

Polymerization Initiator

The polymerizable liquid crystal composition of the embodiment of the present invention preferably contains a polymerization initiator.

The polymerization initiator to be used is preferably a photopolymerization initiator capable of initiating a polymerization reaction upon irradiation with ultraviolet rays.

Examples of the photopolymerization initiator include α-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-40799B (JP-S63-40799B), JP1993-29234B (JP-H05-29234B), JP1998-95788A (JP-H10-95788A), and JP1998-29997A (JP-H10-29997A)).

In addition, in the present invention, it is also preferable that the polymerization initiator is an oxime-type polymerization initiator, and specific examples of the polymerization initiator include the initiators described in paragraphs [0049] to [0052] of WO2017/170443A.

Solvent

It is preferable that the polymerizable liquid crystal composition of the embodiment of the present invention contains a solvent from the viewpoint of workability for forming a cured product (for example, an optically anisotropic layer) of an embodiment of the present invention, which will be described later.

Specific examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these may be used singly or in combination of two or more kinds thereof.

Leveling Agent

It is preferable that the polymerizable liquid crystal composition of the embodiment of the present invention contains a leveling agent from the viewpoint that the surface of a cured product of an embodiment of the present invention, which will be described later, is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Specific examples of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). In addition, the leveling agent may also function as an alignment control agent which will be described later.

Alignment Control Agent

The polymerizable liquid crystal composition of the embodiment of the present invention can contain an alignment control agent, as desired.

With the alignment control agent, various alignment states such as homeotropic alignment (vertical alignment), tilt alignment, hybrid alignment, and cholesteric alignment can be formed, in addition to the homogeneous alignment, and specific alignment states can be controlled and achieved more uniformly and more accurately.

As an alignment control agent which accelerates the homogeneous alignment, for example, a low-molecular-weight alignment control agent or a high-molecular-weight alignment control agent can be used.

With regard to the low-molecular-weight alignment control agent, reference can be made to the description in, for example, paragraphs [0009] to [0083] of JP2002-20363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Furthermore, examples of the alignment control agent that forms or accelerates the homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are hereby incorporated by reference.

On the other hand, the cholesteric alignment can be achieved by adding a chiral agent to the polymerizable liquid crystal composition of the embodiment of the present invention, and it is possible to control the direction of revolution of the cholesteric alignment by its chiral direction.

Incidentally, it is possible to control the pitch of the cholesteric alignment in accordance with the alignment regulating force of the chiral agent.

In a case where an alignment control agent is contained, a content thereof is preferably 0.01% to 10% by mass, and more preferably 0.05% to 5% by mass with respect to the mass of the total solid content of the composition. In a case where the content is within the range, it is possible to obtain a cured product which has no precipitation or phase separation, alignment defects, or the like, and is uniform and highly transparent while achieving a desired alignment state.

Other Components

The polymerizable liquid crystal composition of the embodiment of the present invention may contain components other than the above-mentioned components, and examples of such other components include a surfactant, a tilt angle control agent, an alignment assistant, a plasticizer, and a crosslinking agent.

In the present invention, it is preferable that the polymerizable liquid crystal composition of the embodiment of the present invention exhibits a liquid crystal state of a smectic phase for a reason that the contrast of an image display device thus manufactured is better.

Cured Product

The cured product of an embodiment of the present invention is a cured product obtained by curing the above-mentioned polymerizable liquid crystal composition of the embodiment of the present invention, and preferably a cured product obtained by immobilizing the above-mentioned polymerizable liquid crystal composition of the embodiment of the present invention in a liquid crystal state of a smectic phase.

Examples of a method for forming the cured product include a method in which the above-mentioned polymerizable liquid crystal composition of the embodiment of the present invention is used to cause a desired alignment state, and then immobilized by polymerization.

Here, the polymerization conditions are not particularly limited, but in the polymerization by irradiation with light, ultraviolet rays are preferably used. The irradiation dose is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 to 1,000 mJ/cm$^2$. In addition, the polymerization may be carried out under a heating condition in order to accelerate the polymerization reaction.

In addition, in the present invention, the cured product can be formed on any of supports in the optical film of the embodiment of the present invention, which will be described later or a polarizer in the polarizing plate of an embodiment of the present invention, which will be described later.

The cured product of the embodiment of the present invention is preferably an optically anisotropic layer satisfying Formula (III).

$$0.50 < Re(450)/Re(550) < 1.00 \qquad (III)$$

Here, in Expression (III), Re(450) represents an in-plane retardation at a wavelength of 450 nm of the optically anisotropic layer, and Re(550) represents an in-plane retardation at a wavelength of 550 nm of the optically anisotropic layer. In addition, in the present specification, in a case where the measurement wavelength of the retardation is not specified, the measurement wavelength is 550 nm.

Furthermore, the values of the in-plane retardation and the thickness-direction retardation refer to values measured with light at the measurement wavelength using AxoScan OPMF-1 (manufactured by Opto Science, Inc.).

Specifically, by inputting the average refractive index ((Nx+Ny+Nz)/3) and the film thickness (d (μm)) to AxoScan OPMF-1, it is possible to calculate:

Slow axis direction (°)
$Re(\lambda) = R0(\lambda)$
$Rth(\lambda) = ((nx+ny)/2 - nz) \times d$.

In addition, R0(λ) is expressed in a numerical value calculated with AxoScan OPMF-1, but means Re(λ).

In addition, such an optically anisotropic layer is preferably a positive A plate or a positive C plate, and more preferably the positive A plate.

Here, the positive A plate (A plate which is positive) and the positive C plate (C plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A plate satisfies the relationship of Expression (A1) and the positive C plate satisfies the relationship of Expression (C1). In addition, the positive A plate has an Rth showing a positive value and the positive C plate has an Rth showing a negative value.

$nx > ny \approx nz$ \hfill Expression (A1)

$$nz > nx \approx ny \quad \text{Expression (C1)}$$

Furthermore, the symbol, "≈", encompasses not only a case where the both sides are completely the same as each other but also a case where the both are substantially the same as each other.

The expression, "substantially the same", means that with regard to the positive A plate, for example, a case where (ny−nz)×d (in which d is the thickness of a film) is −10 to 10 nm, and preferably −5 to 5 nm is also included in "ny≈nz", and a case where (nx−nz)×d is −10 to 10 nm, and preferably −5 to 5 nm is also included in "nx≈nz". In addition, with regard to the positive C plate, for example, a case where (nx−ny)×d (in which d is the thickness of a film) is 0 to 10 nm, and preferably 0 to 5 nm is also included in "nx≈ny".

In a case where the optically anisotropic layer is a positive A plate, the Re(550) is preferably 100 to 180 nm, more preferably 120 to 160 nm, still more preferably 130 to 150 nm, and particularly preferably 130 to 140 nm, from the viewpoint that the optically anisotropic layer functions as a λ/4 plate.

Here, the "λ/4 plate" is a plate having a λ/4 function, specifically, a plate having a function of converting a linearly polarized light at a certain specific wavelength into a circularly polarized light (or converting a circularly polarized light to a linearly polarized light).

Optical Film

The optical film of an embodiment of the present invention is an optical film having the cured product of the embodiment of the present invention.

FIG. 1 is a schematic cross-sectional view showing an example of the optical film of the embodiment of the present invention.

Furthermore, FIG. 1 is a schematic view, and the thicknesses relationship, the positional relationship, and the like among the respective layers are not necessarily consistent with actual ones, and either of the support shown in FIG. 1 and an alignment film are optional constitutional members.

An optical film 10 shown in FIG. 1 has a support 16, an alignment film 14, and an optically anisotropic layer 12 as the cured product in this order.

In addition, the optically anisotropic layer 12 may be a laminate of two or more different optically anisotropic layers. For example, in a case where the polarizing plate of the embodiment of the present invention which will be described later is used as a circularly polarizing plate or in a case where the optical film of the embodiment of the present invention is used as an optical compensation film for an IPS mode or an FFS mode liquid crystal display device, the optically anisotropic layer 12 is preferably a laminate of a positive A plate and a positive C plate.

In addition, the optically anisotropic layer may be peeled from the support, and the optically anisotropic layer may be used alone as an optical film.

Hereinafter, various members used for the optical film of the embodiment of the present invention will be described in detail.

Cured Product

The cured product contained in the optical film of the embodiment of the present invention is the above-mentioned cured product of the embodiment of the present invention.

In the optical film of the embodiment of the present invention, the thickness of the cured product is not particularly limited, but in a case where the optical film functions as an optically anisotropic layer, the thickness of the cured product is preferably 0.1 to 10 μm, and more preferably 0.5 to 5 μm.

Support

The optical film of the embodiment of the present invention may have a support as a base material for forming a cured product as described above.

Such a support is preferably transparent, and specifically, it preferably has a light transmittance of 80% or more.

Examples of such a support include a glass substrate and a polymer film, and examples of the material for the polymer film include celulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

In the present invention, a thickness of the support is not particularly limited, but is preferably 5 to 60 μm, and more preferably 5 to 40 μm.

Alignment Film

In a case where the optical film of the embodiment of the present invention has any of the above-mentioned supports, it is preferable that the optical film has an alignment film between the support and the cured product. Furthermore, an aspect in which the above-mentioned support may also function as an alignment film is also available.

The alignment film generally has a polymer as a main component. The materials for the polymer material for an alignment film are described in many documents, and many commercially available products can be used.

The polymer material used in the present invention is preferably a polyvinyl alcohol or a polyimide, or a derivative thereof. Particularly, a modified or non-modified polyvinyl alcohol is preferable.

Examples of the alignment film that can be used in the present invention include the alignment films described for Line 24 on Page 43 to Line 8 on Page 49 of WO01/88574A; the modified polyvinyl alcohols described in paragraphs [0071] to [0095] of JP3907735B; and the liquid crystal alignment film formed by a liquid crystal alignment agent described in JP2012-155308A.

In the present invention, for a reason that it is possible to prevent deterioration in the surface condition by avoiding a contact with the surface of an alignment film upon formation of the alignment film, a photo-alignment film is also preferably used as the alignment film.

The photo-alignment film is not particularly limited, but the polymer materials such as a polyamide compound and a polyimide compound, described in paragraphs [0024] to [0043] of WO2005/096041A; the liquid crystal alignment film formed by a liquid crystal alignment agent having a photo-alignment group, described in JP2012-155308A; LPP-JP265CP, trade name, manufactured by Rolic Technologies Ltd.; or the like can be used.

In addition, in the present invention, the thickness of the alignment film is not particularly limited, but from the viewpoint of forming an optically anisotropic layer having a uniform film thickness by mitigating the surface roughness that can be present on the support, the thickness is preferably 0.01 to 10 µm, more preferably 0.01 to 1 µm, and still more preferably 0.01 to 0.5 µm.

Ultraviolet Absorber

The optical film of the embodiment of the present invention preferably includes an ultraviolet (UV) absorber, taking an effect of external light (particularly ultraviolet rays) into consideration.

The ultraviolet absorber may be contained in the cured product of the embodiment of the present invention or may also be contained in a member other than the cured product constituting the optical film of the embodiment of the present invention. Suitable examples of the member other than the cured product include a support.

As the ultraviolet absorber, any one of ultraviolet absorbers known in the related art, which can express ultraviolet absorptivity, can be used. Among such the ultraviolet absorbers, a benzotriazole-based or hydroxyphenyltrazine-based ultraviolet absorber is preferably used from the viewpoint that it has high ultraviolet absorptivity and ultraviolet absorbing ability (ultraviolet-shielding ability) used for an image display device is obtained.

In addition, in order to broaden ultraviolet absorbing ranges, two or more kinds of ultraviolet absorbers having different maximum absorption wavelengths can be used in combination.

Specific examples of the ultraviolet absorber include the compounds described in paragraphs [0258] and [0259] of JP2012-18395A and the compounds described in paragraphs [0055] to [0105] of JP2007-72163A.

In addition, as a commercially available product thereof, for example, Tinuvin 400, Tinuvin 405, Tinuvin 460, Tinuvin 477, Tinuvin 479, and Tinuvin 1577 (all manufactured by BASF), or the like can be used.

Polarizing Plate

A polarizing plate of an embodiment of the present invention has the above-mentioned optical film of the embodiment of the present invention and a polarizer.

Furthermore, in a case where the above-mentioned optically anisotropic layer of the embodiment of the present invention is a λ/4 plate (positive A plate), the polarizing plate of the embodiment of the present invention can be used as a circularly polarizing plate.

In a case where the polarizing plate of the embodiment of the present invention is used as a circularly polarizing plate, the above-mentioned optically anisotropic layer of the embodiment of the present invention is used as a λ/4 plate (positive A plate), and an angle formed by the slow axis of the λ/4 plate and the absorption axis of a polarizer which will be described later is preferably 30' to 60°, more preferably 40° to 50°, still more preferably 42° to 48°, and particularly preferably 45°.

In addition, the polarizing plate of the embodiment of the present invention can also be used as an optical compensation film for an IPS mode or FFS mode liquid crystal display device.

In a case where the polarizing plate of the embodiment of the present invention is used as an optical compensation film for an IPS mode or FFS mode liquid crystal display device, it is preferable that the above-mentioned optically anisotropic layer of the embodiment of the present invention is used as at least one plate of a laminate of a positive A plate and a positive C plate, an angle formed by the slow axis of the positive A plate layer and the absorption axis of a polarizer which will be described later are orthogonal or parallel, and specifically, it is more preferable that an angle formed by the slow axis of the positive A plate layer and the absorption axis of the polarizer which will be described later is 0° to 5° or 85° to 95°.

Here, the "slow axis" of the λ/4 plate or the positive A plate layer means a direction in which a refractive index in the plane of the λ/4 plate or the positive A plate layer is maximum, and the "absorption axis" of the polarizer means a direction in which the absorbance is highest.

Polarizer

A polarizer contained in a polarizing plate of an embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dying in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

A polarizer in which thin films having different birefringence are laminated, a wire grid-type polarizer, a polarizer having a combination of a cholesteric liquid crystal having a selective reflection range, and a ¼ wavelength plate, or the like is used as the reflective type polarizer.

Among those, a polarizer including a polyvinyl alcohol-based resin (a polymer including —$CH_2$—CHOH— as a repeating unit, in particular, at least one selected from the group consisting of a polyvinyl alcohol and an ethylene-vinyl alcohol copolymer) is preferable from the viewpoint that it has more excellent adhesiveness.

In the present invention, the thickness of the polarizer is not particularly limited, but is preferably 3 µm to 60 µm, more preferably 3 µm to 30 µm, and still more preferably 3 µm to 10 µm.

Pressure Sensitive Adhesive Layer

The polarizing plate of the embodiment of the present invention may have a pressure sensitive adhesive layer arranged between the cured product in the optical film of the embodiment of the present invention and the polarizer.

The pressure sensitive adhesive layer used for lamination of the cured product and the polarizer represents, for example, a substance in which a ratio (tan δ=G"/G') between a storage elastic modulus G' and a loss elastic modulus G", each measured with a dynamic viscoelastometer, is 0.001 to 1.5, and examples thereof include a so-called pressure sensitive adhesive or a readily creepable substance. Examples of the pressure sensitive adhesive that can be used in the present invention include a polyvinyl alcohol-based pressure sensitive adhesive, but the pressure sensitive adhesive is not limited thereto.

Adhesive Layer

The polarizing plate of the embodiment of the present invention may have an adhesive layer arranged between the optically anisotropic layer in the optical film of the embodiment of the present invention and the polarizer.

As the adhesive layer used for laminating a cured product and a polarizer, a curable adhesive composition that is cured by irradiation with active energy rays or heating is preferable.

Examples of the curable adhesive composition include a curable adhesive composition containing a cationically polymerizable compound and a curable adhesive composition containing a radically polymerizable compound.

A thickness of the adhesive layer is preferably 0.01 to 20 μm, more preferably 0.01 to 10 μm, and still more preferably 0.05 to 5 μm. In a case where the thickness of the adhesive layer is within this range, floating or peeling does not occur between the protective layer or optically anisotropic layer and the polarizer, which are laminated, and a practically acceptable adhesive force can be obtained.

Image Display Device

An image display device of an embodiment of the present invention is an image display device having the optical film of the embodiment of the present invention or the polarizing plate of the embodiment of the present invention.

A display element used in the image display device of the embodiment of the present invention is not particularly limited, and examples thereof include a liquid crystal cell, an organic electroluminescent (hereinafter simply referred to as "EL") display panel, and a plasma display panel.

Among those, the liquid crystal cell and the organic EL display panel are preferable, and the liquid crystal cell is more preferable. That is, as the image display device of the embodiment of the present invention, a liquid crystal display device using a liquid crystal cell as a display element or an organic EL display device using an organic EL display panel as a display element is preferable, and the liquid crystal display device is more preferable.

Liquid Crystal Display Device

A liquid crystal display device which is an example of the image display device of the embodiment of the present invention is a liquid crystal display device having the above-mentioned polarizing plate of the embodiment of the present invention and a liquid crystal cell.

In addition, in the present invention, it is preferable that the polarizing plate of the embodiment of the present invention is used as the polarizing plate of the front side, and it is more preferable that the polarizing plate of the embodiment of the present invention is used as the polarizing plates on the front and rear sides, among the polarizing plates provided on the both sides of the liquid crystal cell.

Hereinafter, the liquid crystal cell constituting the liquid crystal display device will be described in detail.

<Liquid Crystal Cell>

The liquid crystal cell used for the liquid crystal display device is preferably in a vertical alignment (VA) mode, an optically compensated bend (OCB) mode, an in-plane-switching (IPS) mode, a fringe-field-switching (FFS) mode, or a twisted nematic (TN) mode, but is not limited thereto.

In a TN-mode liquid crystal cell, rod-shaped liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-shaped liquid crystal molecules are substantially vertically aligned during no voltage application thereto. Examples of the VA-mode liquid crystal cell include (1) a VA-mode liquid crystal cell in the narrow sense of the word, in which rod-shaped liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA-mode is multi-domained for viewing angle enlargement (described in SID97, Digest of Tech. Papers (preprint), 28 (1997) 845), (3) a liquid crystal cell in a mode (n-ASM mode) in which rod-shaped liquid crystal molecules are substantially vertically aligned during no voltage application thereto and are twistedly multi-domain-aligned during voltage application thereto (described in Seminar of Liquid Crystals of Japan, Papers (preprint), 58-59 (1998)), and (4) a survival-mode liquid crystal cell (announced in LCD International 98). In addition, the liquid crystal cell may be of any of a patterned vertical alignment (PVA) type, an optical alignment type, and a polymer-sustained alignment (PSA) type. Details of these modes are specifically described in JP2006-215326A and JP2008-538819A.

In an IPS-mode liquid crystal cell, rod-shaped liquid crystal molecules are aligned substantially parallel with respect to a substrate, and application of an electric field parallel to the substrate surface causes the liquid crystal molecules to respond planarly. The IPS-mode displays black in a state where no electric field is applied and a pair of upper and lower polarizing plates have absorption axes which are orthogonal to each other. A method of improving the viewing angle by reducing light leakage during black display in an oblique direction using an optical compensation sheet is disclosed in JP1998-54982A (JP-H10-54982A), JP1999-202323A (JP-H11-202323A), JP1997-292522A (JP-H09-

292522A), JP1999-133408A (JP-H11-133408A), JP1999-305217A (JP-H11-305217A), JP1998-307291A (JP-H10-307291A), and the like.

Organic EL Display Device

Suitable examples of the organic EL display device which is an example of the image display device of the embodiment of the present invention include an aspect which includes, from the visible side, a polarizer, a λ/4 plate (a positive A plate) including the optically anisotropic layer of the embodiment of the present invention, and an organic EL display panel in this order.

Furthermore, the organic EL display panel is a display panel composed of an organic EL device in which an organic light emitting layer (organic electroluminescent layer) is sandwiched between electrodes (between a cathode and an anode). The configuration of the organic EL display panel is not particularly limited but a known configuration is adopted.

EXAMPLES

Hereinafter, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention.

Therefore, the scope of the present invention should not be construed as being limited to Examples shown below.

Example 1

Manufacture of Protective Film 1

<Preparation of Core Layer Cellulose Acylate Dope 1>

The following composition was put into a mixing tank and stirred to dissolve the respective components to prepare a core layer cellulose acylate dope 1.

| Core layer cellulose acylate dope 1 | |
|---|---|
| Cellulose acetate having a degree of acetyl substitution of 2.88 | 100 parts by mass |
| Ester oligomer (the following compound 1-1) | 10 parts by mass |
| Durability improver (the following compound 1-2) | 4 parts by mass |
| Ultraviolet absorber (the following compound 1-3) | 3 parts by mass |
| Methylene chloride (the first solvent) | 438 parts by mass |
| Methanol (the second solvent) | 65 parts by mass |

Compoud 1-1

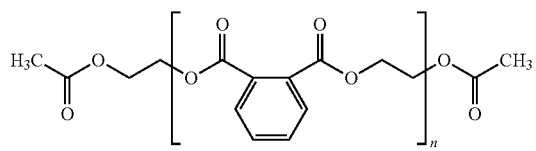

Compoud 1-2

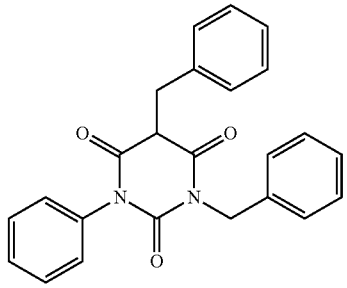

Compoud 1-3

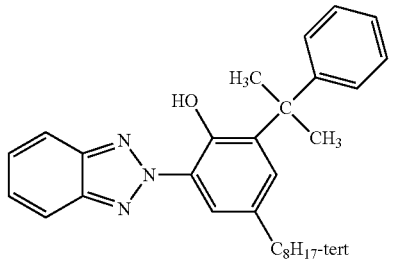

<Preparation of Outer Layer Cellulose Acylate Dope 1>

10 parts by mass of the following matting agent dispersion liquid 1 was added to 90 parts by mass of the core layer cellulose acylate dope 1 to prepare an outer layer cellulose acylate dope 1.

| Matting agent solution | |
|---|---|
| Silica particles with an average particle size of 20 nm (AEROSIL R972, manufactured by Nippon Aerosil Co., Ltd.) | 2 parts by mass |
| Methylene chloride (the first solvent) | 76 parts by mass |
| Methanol (the second solvent) | 11 parts by mass |
| Core layer cellulose acylate dope 1 | 1 part by mass |

<Manufacture of Protective Film 1>

Three layers of the core layer cellulose acylate dope 1 and the outer layer cellulose acylate dopes 1 on both sides thereof were simultaneously casted from a casting port onto a drum at 20° C. In a state where a content of the solvent in the film on the drum was approximately 20% by mass, the film was peeled from the drum, and both ends of the obtained film in the width direction were fixed with tenter clips, and in a state where a content of the residual solvent in the film was 3% to 15% by mass, the film was stretched 1.2 times in the transverse direction and dried. Thereafter, the obtained film was transported between the rolls of a heat treatment device to manufacture a cellulose acylate film 1 with a thickness of 25 μm, which was used as a protective film 1.

Manufacture of Protective Film 1 with Hardcoat Layer

As a coating liquid for forming a hardcoat layer, a curable composition (hardcoat layer 1) for a hardcoat layer described in Table 4 below was prepared.

TABLE 4

| | Monomer | | | UV initiator | | |
|---|---|---|---|---|---|---|
| | Monomer 1 | Monomer 2 | Monomer 1/monomer 2 | Sum of addition amounts [parts by mass] | Type | Addition amount [parts by mass] | Solvent |
| Hardcoat layer 1 | Pentaerythritol triacrylate | Pentaerythritol tetraacrylate | 3/2 | 53.5 | UV initiator 1 | 1.5 | Ethyl acetate |

The structure of a UV initiator 1 in Table 4 above is shown below.

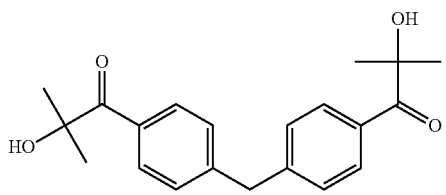 [SMILES: CC(C)(O)C(=O)c1ccc(Cc2ccc(C(=O)C(C)(C)O)cc2)cc1]

The curable composition 1 for a hardcoat layer was applied onto a surface of the protective film 1 manufactured above, then dried at 100° C. for 60 seconds, irradiated with UV at 1.5 kW and 300 mJ under the condition of 0.1% or less of nitrogen, and cured to manufacture a protective film 1 with a hardcoat layer, having a hardcoat layer with a film thickness of 5 μm. Furthermore, adjustment of the film thickness of the hardcoat layer was performed by adjusting a coating amount by a die coating method, using a slot die.

Manufacture of Polarizing Plate 1 With Protective Film on One Surface (1) Saponification of Film The manufactured protective film 1 with a hardcoat layer was immersed for 1 minute in a 4.5 mol/L aqueous sodium hydroxide solution (saponified solution) whose temperature had been adjusted to 37° C., and then the film was washed with water, then immersed in a 0.05 mol/L aqueous sulfuric acid solution for 30 seconds, and then further passed through a water washing bath. Then, the obtained film was repeatedly dehydrated three times with an air knife to drop water, and then the film was dried by leaving it in a drying zone at 70° C. for 15 seconds to manufacture a protective film 1 with a hardcoat layer, which had been saponified.

(2) Manufacture of Polarizer

According to Examples of JP2016-148724A, a polarizer with a film thickness of 15 μm was prepared by providing a peripheral speed difference between two pairs of nip rolls and performing stretching in the longitudinal direction. The polarizer thus manufactured was used as a polarizer 1.

(3) Bonding

The polarizer 1 thus obtained and the protective film 1 with a hardcoat layer which had been subjected to the saponification treatment were bonded in a roll-to-roll manner so that the polarizing axis and the longitudinal direction of the film were orthogonal to each other, using a 3% aqueous PVA solution (manufactured by Kuraray Co., Ltd., PVA-117H) as an adhesive, thereby manufacturing a polarizing plate 1 with a protective film on one surface (hereinafter also simply referred to as a "polarizing plate 1"). At this time, the bonding was performed so that the cellulose acylate film side of the protective film came on the polarizer side.

Manufacture of Optical Film 2

<Preparation of Polymethyl Methacrylate (PMMA) Dope>

The following dope composition was put into a mixing tank and stirred to dissolve each component to prepare a PMMA dope.

| PMMA Dope | |
|---|---|
| PMMA resin | 100 parts by mass |
| Sumilizer GS (manufactured by Sumitomo Chemical Co., Ltd.) | 0.1 parts by mass |
| Dichloromethane | 426 parts by mass |
| Methanol | 64 parts by mass |

<Manufacture of PMMA Film>

The manufactured PMMA dope was uniformly cast on a stainless steel-made band (casting support) from a casting die (band casting machine). The film was peeled in a state where the solvent content in the cast film was approximately 20% by mass, and the both ends of the film in the width direction were fixed with tenter clips and dried while the film was stretched at a stretching ratio of 1.1 times in the transverse direction. Thereafter, the obtained film was transported between the rolls of a heat treatment device and further dried to manufacture a PMMA film with a film thickness of 20 μm, which was used as a protective film 2.

Manufacture of First Polarizing Plate

<Preparation of Adhesive Solution>

The following compounds were mixed in the ratio described to prepare an adhesive solution A.
  Aronix M-220 (manufactured by Toagosei Co., Ltd.): 20 parts by mass
  4-Hydroxybutyl acrylate (manufactured by Nihon Kasei Co., Ltd.): 40 parts by mass
  2-Ethylhexyl acrylate (manufactured by Mitsubishi Chemical Corporation): 40 parts by mass
  Irgacure 907 (manufactured by BASF): 1.5 parts by mass
  KAYACURE DETX-S (manufactured by Nippon Kayaku Co., Ltd.): 0.5 parts by mass The polarizer-bonded surface of the protective film 2 was corona-treated with a discharge amount of 150 W·min/m², and then the prepared adhesive solution A was coated so that the film thickness was 0.5 μm.

Then, the adhesive-coated surface was bonded to the polarizer surface of the polarizing plate 1 with a protective film on one surface manufactured above, and irradiated with ultraviolet rays from the protective film 2 (PMMA film) side at 300 mJ/cm² at 40° C. in an air atmosphere.

Thereafter, the resultant was dried at 60° C. for 3 minutes to manufacture a first polarizing plate.

Manufacture of Optically Anisotropic Layer 1

<Preparation of Composition 1 for Photo-Alignment Film>

8.4 parts by mass of the following copolymer C1 and 0.3 parts by mass of the following thermal acid generator D¹ were added to butyl acetate/methyl ethyl ketone (80 parts by mass/20 parts by mass) to prepare a composition for a photo-alignment film.

Copolymer C1 (weight-average molecular weight: 40,000, the numerical value in the following formula indicates a content (% by mass) of each repeating unit)

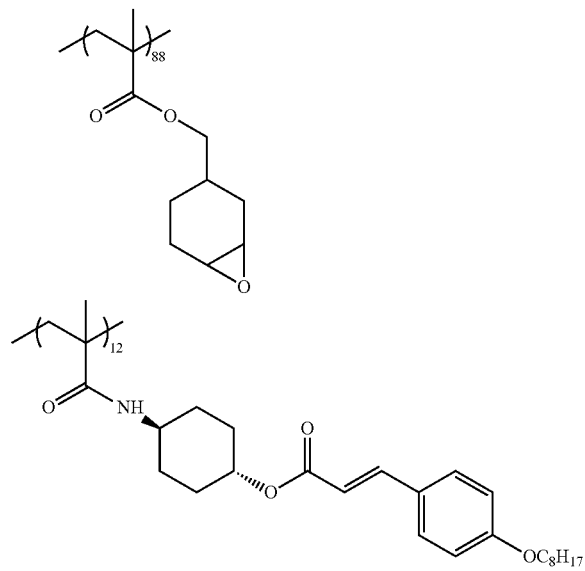

Thermal acid generator D1

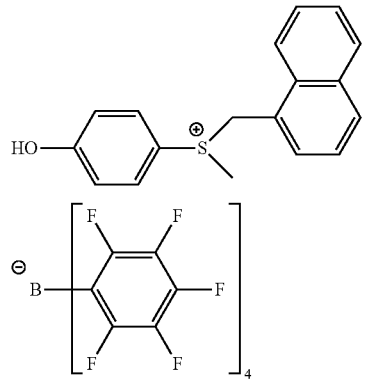

<Preparation of Composition 1 for Forming Optically Anisotropic Layer>

A composition 1 for forming an optically anisotropic layer having the following composition was prepared.

| Composition 1 for forming an optically anisotropic layer | |
|---|---|
| The following reverse dispersion liquid crystal compound A1 | 90 parts by mass |
| The following specific compound B1 | 10 parts by mass |
| The following polymerization initiator S1 | 1 part by mass |
| The following leveling agent P1 | 0.09 parts by mass |
| Cyclopentanone | 300 parts by mass |

Moreover, a group adjacent to the acryloyloxy group of the following reverse dispersion liquid crystal compound A1 represents a propylene group (a group obtained by substituting a methyl group with an ethylene group), and the following reverse dispersion liquid crystal compound A1 represents a mixture of regioisomers in which the positions of the methyl groups are different from each other.

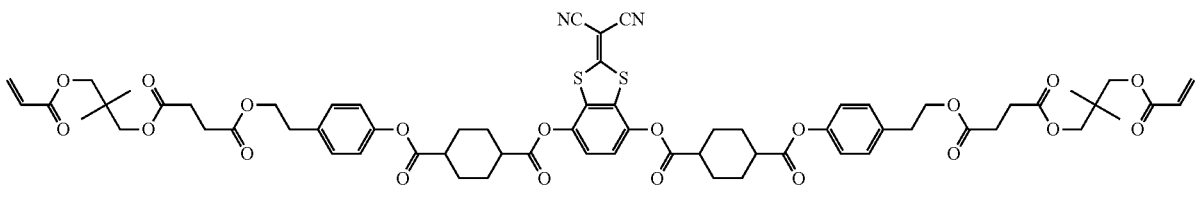

Reverse dispersion liquid crystal compound A1 (Cr 109 SA 133 N 154 Is)

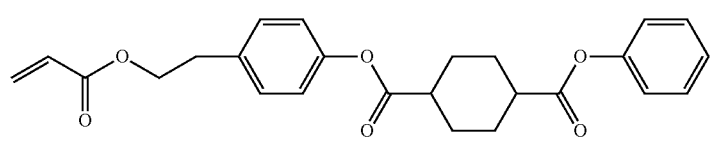

Specific compound B1

Polymerization initiator S1

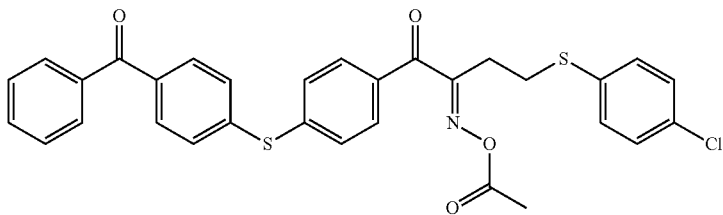

Leveling agent P1 (in the following formula, a to c satisfy a:b:c=66:26:8, and represent a content (% by mole) of each repeating unit with respect to all repeating units in the resin)

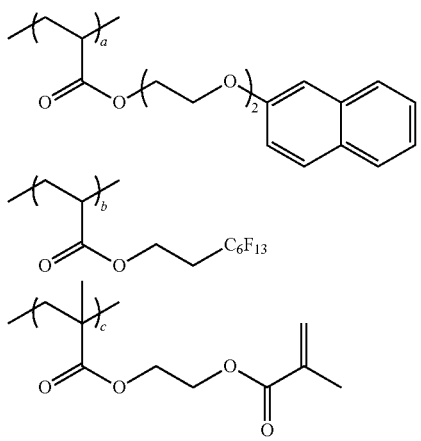

<Manufacture of Optically Anisotropic Layer 1>

The composition 1 for a photo-alignment film prepared in advance was applied onto a glass substrate with a bar coater. After the application, the film was dried on a hot plate at 120° C. for 5 minute to remove the solvent, thereby forming a photoisomerization composition layer with a thickness of 0.2 μm. The obtained photoisomerization composition layer was irradiated with polarized ultraviolet rays (10 mJ/cm², using an ultra-high-pressure mercury lamp) to form a photo-alignment film 1.

Subsequently, the composition 1 for forming an optically anisotropic layer prepared above was applied onto the photo-alignment film 1 with a spin coater so that the film thickness after drying was 1.0 μm. After the application, the film was heated for 30 seconds in a temperature range indicating the liquid crystal state of a nematic phase, cooled to a temperature 5° C. lower than a phase transition temperature from the nematic phase to a smectic phase, and then irradiated with UV (300 mJ/cm²) at the temperature to manufacture an optically anisotropic layer 1 immobilized in a liquid crystal state of a smectic phase.

Manufacture of First Polarizing Plate for Evaluation

The manufactured optically anisotropic layer 1 and the protective film 2 of the first polarizing plate were bonded, using a 20 m acryl-based pressure sensitive adhesive, so that the absorption axis of the polarizer and the slow axis of the optically anisotropic layer were in parallel directions to manufacture a first polarizing plate for evaluation, including the optically anisotropic layer 1 of Example 1.

Manufacture of Liquid Crystal Display Device

Polarizing plates on the front and back sides from a commercially available liquid crystal display device (iPad (registered trademark), manufactured by Apple Inc.) (liquid crystal display device including a liquid crystal cell in an FFS mode) were peeled, and thus, the first polarizing plate for evaluation of Example 1 manufactured above was bonded therewith with a 20 μm acrylic pressure sensitive adhesive, so that the absorption axis of the polarizer thereof was orthogonal to the absorption axis of the polarizer in the polarizing plate on the back side, and the alignment direction of the liquid crystal in the liquid crystal cell was orthogonal to the absorption axis of the polarizer in the first polarizing plate, thereby manufacturing a liquid crystal display device of Example 1.

Examples 2 to 12 and Comparative Examples 1 to 10

An optically anisotropic layer and a liquid crystal display device were manufactured by the same method as in Example 1, except that the reverse dispersion liquid crystal compound A1 and the specific compound B1 were each changed to compounds shown in Table 5 below.

Furthermore, in Table 5 below, the structures of the reverse dispersion liquid crystal compound A2 and the like are shown below.

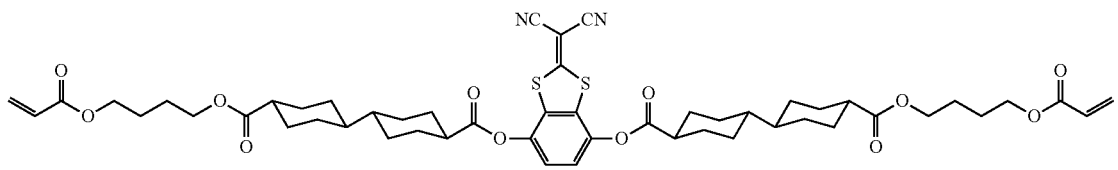

Reverse dispersion liquid crystal compound A2 (Cr 136 SA 204 N 280 Is)

-continued
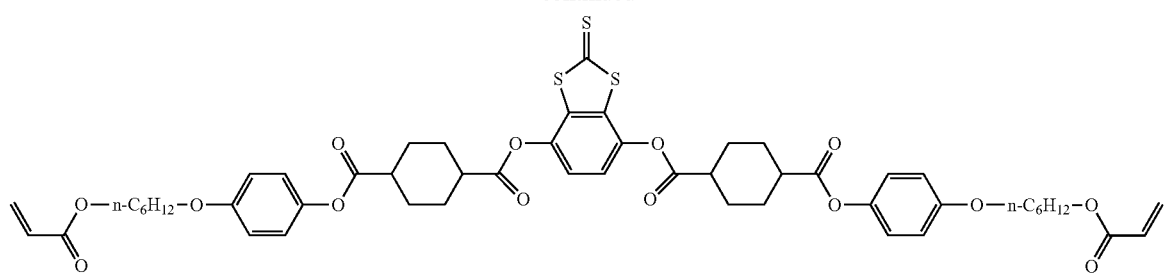
Reverse dispersion liquid crystal compound A3 (Cr 124 SA 164 N 247 Is)
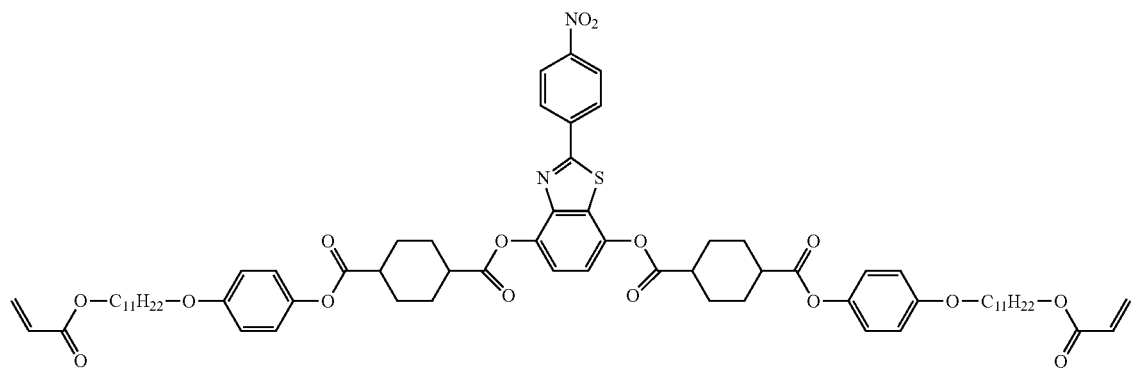
Reverse dispersion liquid crystal compound A4 (Cr 151 SA 167 N 195 Is)
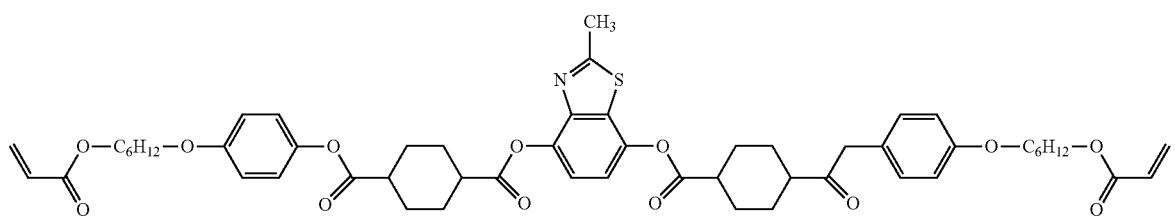
Reverse dispersion liquid crystal compound A5 (Cr 101 SA 133 N 146 Is)
Specific compound B2
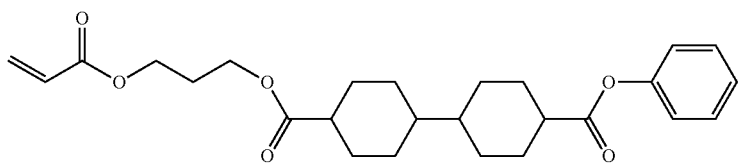
Specific compound B3
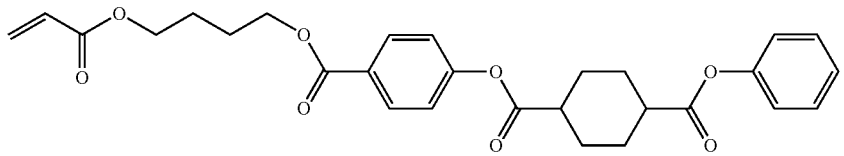
Specific compound B4
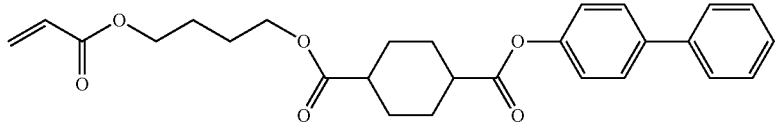
Specific compound B5
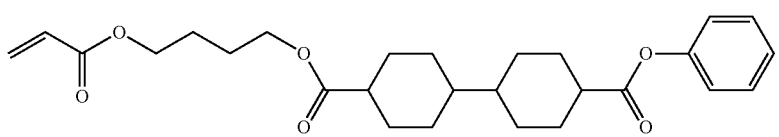

-continued

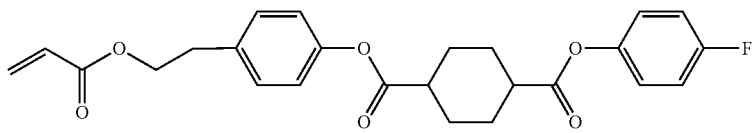

Specific compound B6

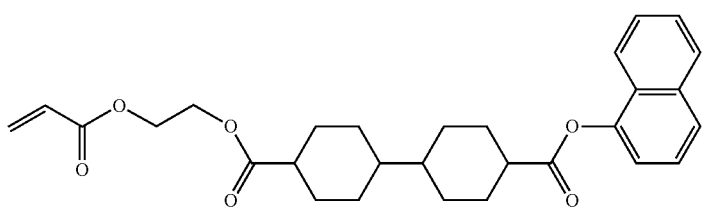

Specific compound B7

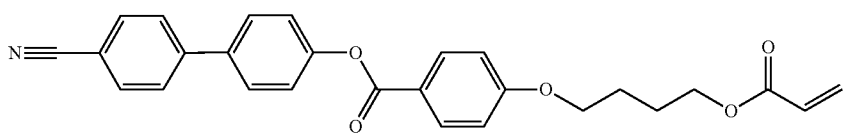

Comparative compound C1

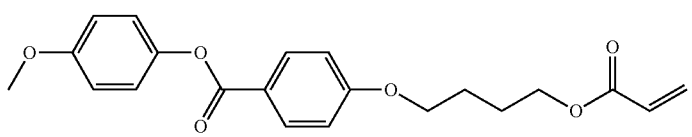

Comparative compound C2

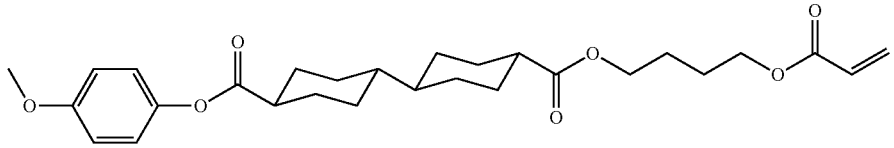

Comparative compound C3

Evaluation

<Contrast>

A luminance (Yw) in the direction vertical to a panel in a white display and a luminance (Yb) in the direction vertical to a panel in a black display were measured using a commercially available measuring apparatus for a liquid crystal viewing angle and chromaticity characteristics, Ezcontrast (manufactured by ELDIM), and a contrast ratio (Yw/Yb) in the direction vertical to the panel was calculated and taken as a front contrast, and evaluated according to the following standard. The results are shown in Table 5 below.

A: 50,000 or more
B: 25,000 or more and less than 50,000
C: 10,000 or more and less than 25,000
D: Less than 10,000

TABLE 5

| | Reverse dispersion liquid crystal compound | | | | | Specific compound and the like | | | | | | | Comparative compound | | | Front contrast |
|---|---|---|---|---|---|---|---|---|---|---|---|---|---|---|---|---|
| | A1 | A2 | A3 | A4 | A5 | B1 | B2 | B3 | B4 | B5 | B6 | B7 | C1 | C2 | C3 | |
| Example 1 | 90 | | | | | 10 | | | | | | | | | | A |
| Example 2 | | 90 | | | | | 10 | | | | | | | | | A |
| Example 3 | | | 90 | | | 10 | | | | | | | | | | A |
| Example 4 | | | | 90 | | 10 | | | | | | | | | | A |
| Example 5 | | | | | 90 | 10 | | | | | | | | | | A |
| Example 6 | 90 | | | | | | | 10 | | | | | | | | A |
| Example 7 | | | 90 | | | | | 10 | | | | | | | | A |
| Example 8 | 90 | | | | | | | | 10 | | | | | | | B |
| Example 9 | 90 | | | | | | | | | 10 | | | | | | B |
| Example 10 | 90 | | | | | | | | | | 10 | | | | | B |
| Example 11 | | 90 | | | | | | | | 10 | | | | | | B |
| Example 12 | | 90 | | | | | | | | | | 10 | | | | B |
| Comparative Example 1 | 100 | | | | | | | | | | | | | | | D |
| Comparative Example 2 | | 100 | | | | | | | | | | | | | | D |
| Comparative Example 3 | | | 100 | | | | | | | | | | | | | D |
| Comparative Example 4 | | | | 100 | | | | | | | | | | | | D |

TABLE 5-continued

| | Reverse dispersion liquid crystal compound | | | | | Specific compound and the like | | | | | | | Comparative compound | | | Front contrast |
|---|---|---|---|---|---|---|---|---|---|---|---|---|---|---|---|---|
| | A1 | A2 | A3 | A4 | A5 | B1 | B2 | B3 | B4 | B5 | B6 | B7 | C1 | C2 | C3 | |
| Comparative Example 5 | | | | | 100 | | | | | | | | | | | D |
| Comparative Example 6 | 90 | | | | | | | | | | | | 10 | | | C |
| Comparative Example 7 | 90 | | | | | | | | | | | | | 10 | | D |
| Comparative Example 8 | | 90 | | | | | | | | | | | | | 10 | C |
| Comparative Example 9 | | | 90 | | | | | | | | | | 10 | | | D |
| Comparative Example 10 | | | 90 | | | | | | | | | | | 10 | | D |

From the results shown in Table 5 above, it was found that in case where no specific compound is added, the contrast is deteriorated (Comparative Examples 1 to 5)

In addition, it was also found that even in a case where a comparative compound having a structure similar to that of the specific compound is blended, the contrast is not improved (Comparative Examples 6 to 10).

In contrast, it was found that in a case where the specific compound is blended, the contrast is good (Examples 1 to 12).

In particular, from the comparison between Examples 1 and Examples 8 and 9, it was found that in a case where $A^1$ and $A^2$ in Formula (I) and $A^5$ in Formula (II) have the same structure, the contrast is better.

Furthermore, from the comparison between Example 1 and Example 10, it was found that in a case where $B^2$ is a hydrogen atom in the groups represented by Formulae (M-1) to (M-3) contained in one terminal of the specific compound, the contrast is better.

Moreover, from the comparison between Example 2 and Example 11, it was found that in a case where the number of atoms in $SP^1$ and $SP^2$ in Formula (I) is larger than the number of atoms in $SP^5$ in Formula (II), the contrast is better.

In addition, from the comparison between Example 2 and Example 12, it was found that in a case where M in Formula (I) is the group represented by Formula (M-1), the contrast is better.

EXPLANATION OF REFERENCES

10: optical film
12: optically anisotropic layer
14: alignment film
16: support

What is claimed is:

1. A polymerizable liquid crystal composition comprising: a compound represented by Formula (I); and a compound represented by Formula (II),

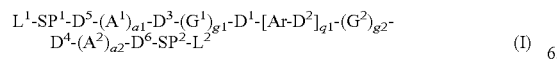

(I)

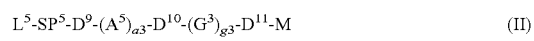

(II)

in Formula (I), a1, a2, g1, and g2 each independently represent 0 or 1, provided that at least one of a1 or g1 represents 1, and at least one of a2 or g2 represents 1, q1 represents 1 or 2, $D^1$, $D^2$, $D^3$, $D^4$, $D^5$, and $D^6$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where q1 is 2, a plurality of $D^2$'s may be the same as or different from each other, $G^1$ and $G^2$ each independently represent an aromatic ring having 6 to 20 carbon atoms, which may have a substituent, or a divalent alicyclic hydrocarbon group having 5 to 20 carbon atoms, which may have a substituent, and one or more of —$CH_2$-'s constituting the alicyclic hydrocarbon group may be substituted with —O—, —S—, or —NH—, $A^1$ and $A^2$ each independently represent an aromatic ring having 6 to 20 carbon atoms, which may have a substituent, or a divalent alicyclic hydrocarbon group having 5 to 20 carbon atoms, which may have a substituent, and one or more of —$CH_2$-'s constituting the alicyclic hydrocarbon group may be substituted with —O—, —S—, or —NH—, $SP^1$ and $SP^2$ each independently represent a single bond, a linear alkylene group having 1 to 12 carbon atoms, a branched alkylene group having 3 to 12 carbon atoms, or a divalent linking group in which one or more of —$CH_2$-'s constituting the linear or branched alkylene group are substituted with —O—, —S—, —NH—, —N(Q)-, or —CO—, where Q represents a substituent, $L^1$ and $L^2$ each independently represent a monovalent organic group, and at least one of $L^1$ or $L^2$ represents a polymerizable group, provided that in a case where Ar is an aromatic ring represented by Formula (Ar-3), at least one of $L^1$ or $L^2$, or $L^3$ or $L^4$ in Formula (Ar-3) represents a polymerizable group, and Ar represents any of aromatic rings selected from the group consisting of groups represented by Formulae (Ar-1) to (Ar-7), provided that in a case where q1 is 2, a plurality of Ar's may be the same as or different from each other,

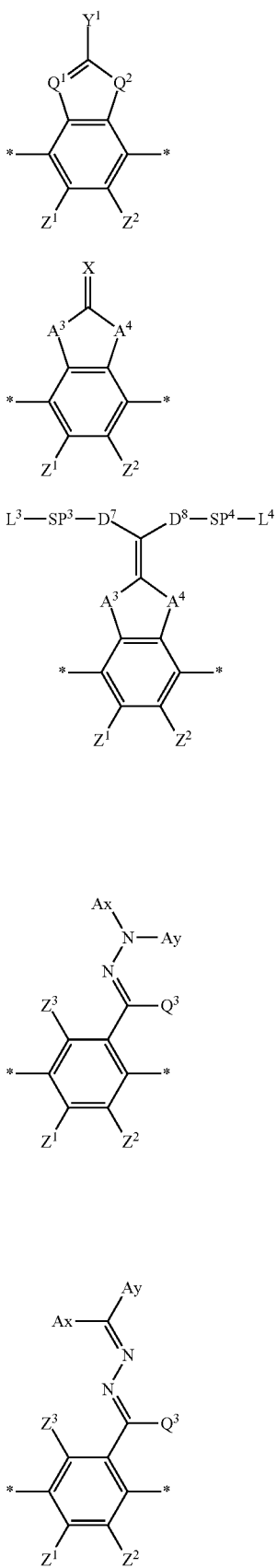

in Formulae (Ar-1) to (Ar-7),
* represents a bonding position to $D^1$ or $D^2$,
$Q^1$ represents N or CH,
$Q^2$ represents —S—, —O—, or —N($R^6$)—, where $R^6$ represents a hydrogen atom or an alkyl group having 1 to 6 carbon atoms,
$Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —$CH_2$-'s constituting the alicyclic hydrocarbon group may be substituted with —O—, —S—, or —NH—,
$Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —$OR^7$, —$NR^8R^9$, —$SR^{10}$, —$COOR^{11}$, or —$COR^{12}$, $R^7$ to $R^{12}$ each independently represent a hydrogen atom or an alkyl group having 1 to 6 carbon atoms, and $Z^1$ and $Z^2$ may be bonded to each other to form an aromatic ring,
$A^3$ and $A^4$ each independently represent a group selected from the group consisting of —O—, —N($R^{13}$)—, —S—, and —CO—, where $R^{13}$ represents a hydrogen atom or a substituent,
X represents a hydrogen atom or a non-metal atom of Groups XIV to XVI to which a substituent may be bonded,
$D^7$ and $D^8$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, SP³ and SP⁴ each independently represent a single bond, a linear alkylene group having 1 to 12 carbon atoms, a branched alkylene group having 3 to 12 carbon atoms, or a divalent linking group in which one or more of —CH₂-'s constituting the linear or branched alkylene group are substituted with —O—, —S—, —NH—, —N(Q)-, or —CO—, where Q represents a substituent, L³ and L⁴ each independently represent a monovalent organic group, and at least one of L³ or L⁴, or L¹ or L² in Formula (I) represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and Q³ represents a hydrogen atom or an alkyl group having 1 to 20 carbon atoms, which may have a substituent, and in Formula (I), a3 and g3 each independently represent an integer of 0 to 2, provided that a3 and g3 represent integers of 1 to 3 in total, D⁹, D¹⁰, and D¹¹ each independently represent a single bond; or —CO—, —O—, —S—, —C(=S)—, —CR¹R²—, —CR³=CR⁴—, —NR⁵—, or a divalent linking group consisting of a combination of two or more of these groups, where R¹ to R⁵ each independently represent a hydrogen atom, a fluorine atom, or an alkyl group having 1 to 12 carbon atoms, G³ represents an aromatic ring having 6 to 20 carbon atoms or a divalent alicyclic hydrocarbon group having 5 to 20 carbon atoms and one or more of —CH₂-'s constituting the alicyclic hydrocarbon group may be substituted with —O—, —S—, or —NH—, provided that in a case where g3 is 2, a plurality of G³'s may be the same as or different from each other, A⁵ represents an aromatic ring having 6 to 20 carbon atoms or a divalent alicyclic hydrocarbon group having 5 to 20 carbon atoms and one or more of —CH₂-'s constituting the alicyclic hydrocarbon group may be substituted with —O—, —S—, or —NH—, provided that in a case where a3 is 2, a plurality of A⁵'s may be the same as or different from each other, SP⁵ represents a single bond, a linear alkylene group having 1 to 12 carbon atoms, a branched alkylene group having 3 to 12 carbon atoms, or a divalent linking group in which one or more of —CH₂-'s constituting the linear or branched alkylene group are substituted with —O—, —S—, —NH—, —N(Q)-, or —CO—, where Q represents a substituent, L⁵ represents a polymerizable group, and M represents any of terminal groups selected from the group consisting of groups represented by Formulae (M-1) to (M-3),

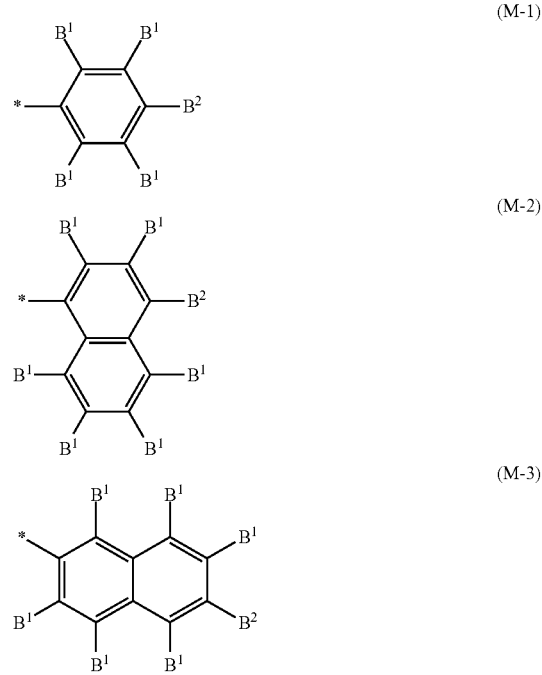

in Formulae (M-1) to (M-3),

* represents a bonding position to D¹¹, a plurality of B¹'s each independently represent a hydrogen atom or a substituent, and B² represents a hydrogen atom or a fluorine atom.

2. The polymerizable liquid crystal composition according to claim 1, wherein the polymerizable liquid crystal composition indicates a liquid crystal state of a smectic phase.

3. The polymerizable liquid crystal composition according to claim 1, wherein all of a1, a2, g1, and g2 in Formula (I) are 1 and both of a3 and g3 in Formula (II) are 1.

4. The polymerizable liquid crystal composition according to claim 1, wherein at least one of A⁵ or G³ in Formula (II) is a 1,4-cyclohexylene group.

5. The polymerizable liquid crystal composition according to claim 1, wherein both of G¹ and G² in Formula (I) are 1,4-cyclohexylene groups, and G³ in Formula (II) is a 1,4-cyclohexylene group.

6. The polymerizable liquid crystal composition according to claim 1, wherein A¹ and A² in Formula (I) and A⁵ in Formula (II) have the same structure.

7. The polymerizable liquid crystal composition according to claim 1, wherein in Formula (I), a1 and a2 are 0, g1 and g2 are 1, and G¹ and G² are 1,4-cyclohexylene groups, and in Formula (II), a3 is 0, g3 is 1, and G³ is a 1,4-cyclohexylene group.

8. The polymerizable liquid crystal composition according to claim 1, wherein L¹ and L² in Formula (I) and L¹ in Formula (II) each represent any of polymerizable groups selected from the group consisting of groups represented by Formulae (P-1) to (P-20),

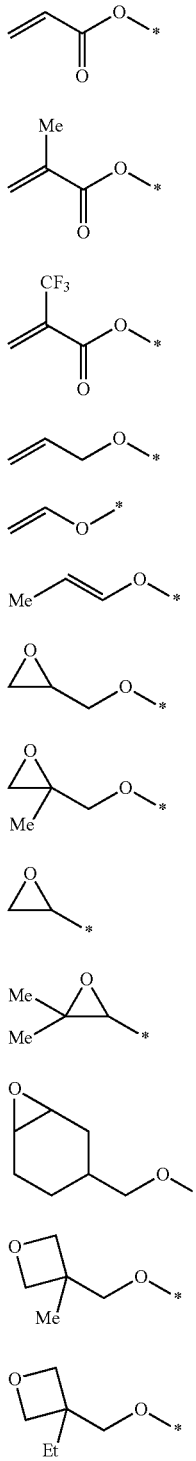
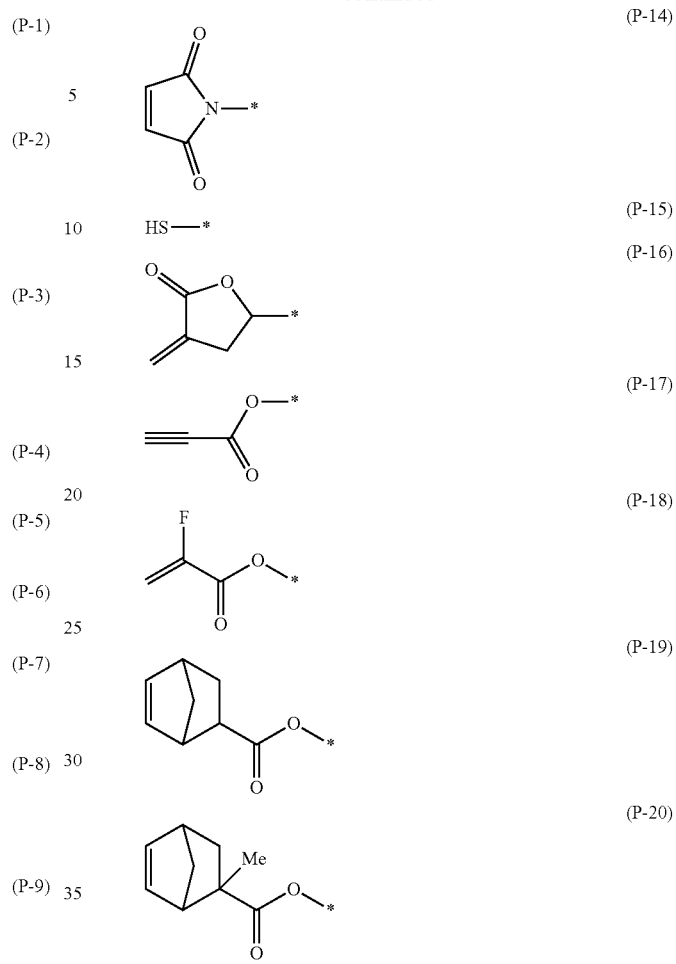

in Formulae (P-1) to (P-20), * represents a bonding position to any of $SP^1$, $SP^2$, and $SP^5$.

9. The polymerizable liquid crystal composition according to claim 1,
wherein a content of the compound represented by Formula (II) is 5 to 100 parts by mass with respect to 100 parts by mass of the compound represented by Formula (I).

10. A cured product obtained by curing the polymerizable liquid crystal composition according to claim 1.

11. An optical film comprising the cured product according to claim 10.

12. A polarizing plate comprising:
the optical film according to claim 11; and
a polarizer.

13. An image display device comprising the optical film according to claim 11.

14. An image display device comprising the polarizing plate according to claim 12.

* * * * *